United States Patent
Atsumi et al.

(10) Patent No.: US 6,320,428 B1
(45) Date of Patent: Nov. 20, 2001

(54) SEMICONDUCTOR INTEGRATED CIRCUIT DEVICE

(75) Inventors: Shigeru Atsumi, Yokohama; Masao Kuriyama, Fujisawa; Akira Umezawa, Yokohama; Hironori Banba, Kamakura; Tadayuki Taura, Zushi; Hidetoshi Saito, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/527,582

(22) Filed: Mar. 17, 2000

Related U.S. Application Data

(62) Division of application No. 09/030,915, filed on Feb. 26, 1998, now Pat. No. 6,052,313.

(30) Foreign Application Priority Data

Feb. 26, 1997 (JP) .................................................. 9-042228
Feb. 27, 1997 (JP) .................................................. 9-044245

(51) Int. Cl.$^7$ ...................................................... H03K 5/22
(52) U.S. Cl. ........................ 327/78; 327/143; 327/198
(58) Field of Search ........................................ 327/143, 198

(56) References Cited

U.S. PATENT DOCUMENTS

| | | | |
|---|---|---|---|
| 5,032,742 | * 7/1991 | Zanders | 327/546 |
| 5,757,714 | 5/1998 | Choi et al. | 365/189.11 |
| 5,828,611 | 10/1998 | Kaneko et al. | 365/189.11 |
| 5,867,047 | * 2/1999 | Kraus | 327/143 |
| 5,917,766 | 6/1999 | Tsuji et al. | 365/189.11 |
| 6,188,266 | * 2/2001 | Shimoda | 327/393 |

FOREIGN PATENT DOCUMENTS

| | | |
|---|---|---|
| 0 476 282 A2 | 3/1992 | (EP) . |
| 2-116084 | 4/1990 | (JP) . |
| 6-243677 | 9/1994 | (JP) . |

* cited by examiner

*Primary Examiner*—Kenneth B. Wells
(74) *Attorney, Agent, or Firm*—Banner & Witcoff, Ltd.

(57) ABSTRACT

A semiconductor integrated circuit device has a data storage section for storing mode setting data corresponding to products of a plurality of types, redundancy data, and so on. The redundancy storage section is made up of a nonvolatile transistor for storing the mode setting data corresponding to the products, the redundancy data, etc., a latch circuit for latching data read out from the nonvolatile transistor and generating a mode signal, and a transmission gate for transmitting the data from read out from the nonvolatile transistor to the latch circuit. The semiconductor integrated circuit device also has an internal voltage generator for generating an internal voltage. This internal voltage is used as the power supply voltage of the data storage section.

10 Claims, 23 Drawing Sheets

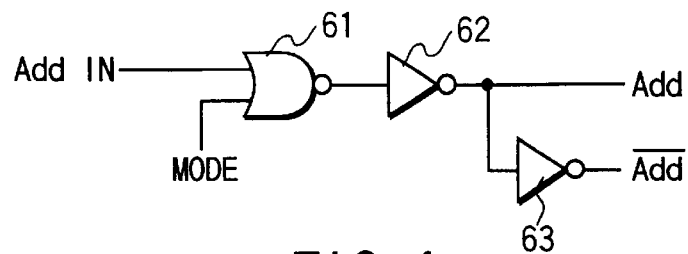
FIG. 4
| | Vg | Vd | Vs |
|---|---|---|---|
| WRITE | 10V | 6V | 0V |
| ERASE | −7V | OPEN | 6V |
| READ | 5V | 1V | 0V |
FIG. 5
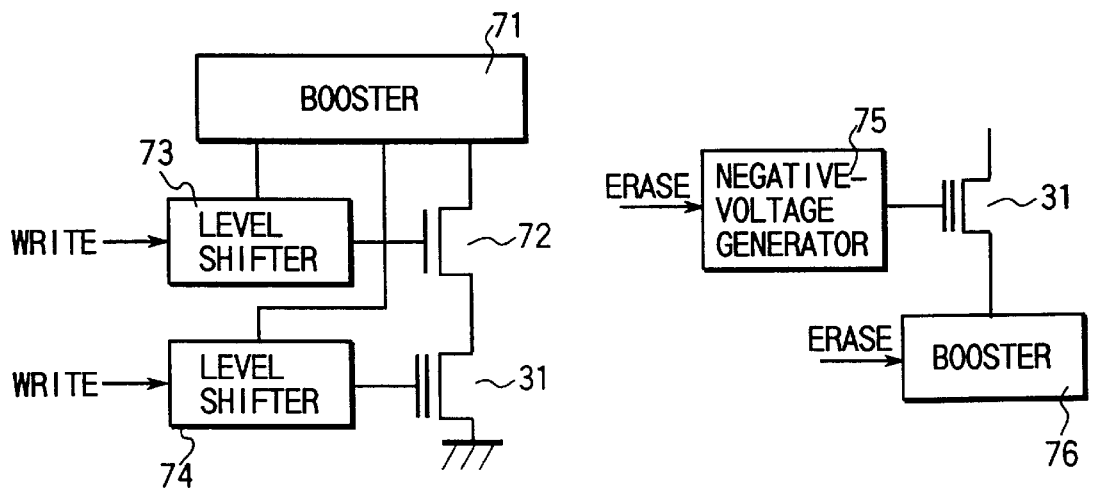
FIG. 6A    FIG. 6B

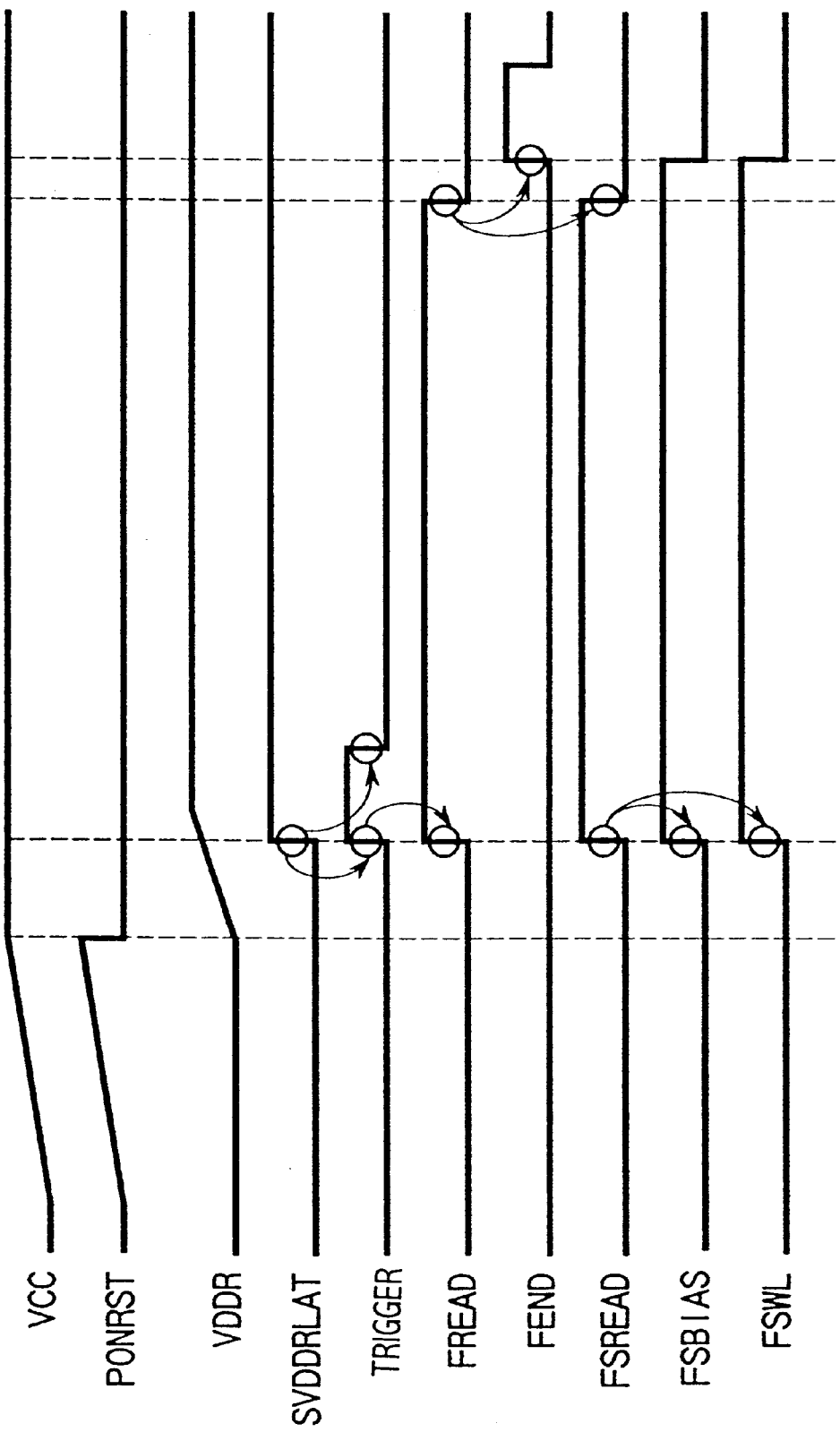

SEMICONDUCTOR INTEGRATED CIRCUIT DEVICE

This application is a divisional of prior application Ser. No. 09/030,915 filed Feb. 26, 1998, now U.S. Pat. No. 6,052,313.

BACKGROUND OF THE INVENTION

The present invention relates to a semiconductor integrated circuit device which comprises a data storage section, formed inside a chip, for storing desirable mode setting data corresponding to products of a plurality of types, redundancy data, and so on.

Examples of product types in a semiconductor integrated circuit device are (1) a product type in which the layout of pads depends on a package such as TSOP (Thin Small Outline Package)/SOP (Small Outline Package), and the locations of pads to be used are switched, (2) a product type in which parallel data have different bit lengths such as ×4, ×8, and ×16, and the numbers of I/O blocks and sense amplifiers to be activated change in accordance with a bit length, and (3) a product type in which addressing changes such that the top and bottom of an address for designating an irregular block are switched in an irregular-block product in a flash EEPROM.

In the semiconductor integrated circuit device having a plurality of different modes, the operation mode of the device must be determined by some method.

In general, either of the master slice or bonding option methods is conventionally selected in order to develop one mask set into the types of products having a plurality of different modes.

In the master slice method, different modes are switched by exchanging, e.g., Al masks. This method is generally used in developing one mask set into a plurality of mode types.

On the other hand, the bonding option method uses an input signal from a dummy pad to select a different mode. A power supply voltage or ground potential is applied to the dummy pad to determine the mode of an integrated circuit by either potential.

A semiconductor integrated circuit device in which a plurality of product types are developed by the bonding option method is disclosed in, e.g., the following reference: EUROPEAN PATENT Publication Number 0 476 282 A2 (lines 29–44, p. 10, FIG. 1n and the like).

In the bonding option method, no plurality of masks need be prepared compared to the master slice method, and data need not be managed in correcting the mask.

In the master slice method, one product type requires one mask. Assume that four product types are simultaneously developed, and the product type is switched by Al masks. If a given Al mask must be corrected, four Al masks must be corrected, resulting in high mask cost. If the number of times of correction is large, the correction contents may not be completely managed. All functions corresponding to the corrected masks must be checked, and the evaluation is cumbersome.

In the bonding option method, a power supply or ground potential is applied to a dummy pad for determining the contents of a device. Therefore, the dummy pad must be arranged between power supply pins or ground pins. Alternatively, the bonding option exclusively requires a pad connected to the power supply and a pad connected to the ground adjacent to the dummy pad. Since the bonding option method requires a large number of extra pads to lead to an increase in chip area, this method cannot cope with so many modes.

Semiconductor integrated circuit devices designed in consideration of the above technology and comprising data storage sections that store mode setting data corresponding to products of a plurality of types, are disclosed, for example, in the following publications:

Jpn. Pat. Appln. KOKAI Publication No. 2-116084 (the description between the fourteenth line of the lower left column of page 2 and the eleventh line of the lower right column of the same page, and FIG. 2); and Jpn. Pat. Appln. KOKAI Publication No. 6-243677 (the descriptions in paragraphs [0044] and [0102], and FIG. 10)

In the semiconductor integrated circuit device disclosed in each of these publications, mode setting data are stored in a nonvolatile transistor. Due to this feature, the semiconductor integrated circuit device enables one mask set to be developed into a plurality of product types, eliminates the need for extra pads, and does not therefore require an increased chip area.

The data storage section, which includes a nonvolatile transistor, stores mode setting data corresponding to products of a-plurality of types. Accordingly, the data storage section requires very high reliability.

However, the two Japanese KOKAI publication No. 2-116084 and No. 6-243677 do not disclose any measures that can be taken to improve the reliability of the data storage section.

BRIEF SUMMARY OF THE INVENTION

It is the first object of the present invention to increase the reliability of a data memory portion for storing, for example, desired mode setting data corresponding to a plurality of product types to data memory portion being arranged with a chip.

To achieve the first object, according to the present invention, an internal power supply generated within the chip is used as the power supply of the data memory portion instead of an external power supply.

More specifically, in the present invention, by using the internal power supply generated within the chip as the power supply of the data memory portion, a malfunction of the data memory portion caused by, e.g., fluctuations in voltage of the external power supply is prevented.

To further suppress an increase in chip area, the data memory portion requires the same micro-lithography technique as that applied to another integrated circuit portion formed within the same chip. For example, in the data memory portion, a power supply voltage must be decreased.

However, if the power supply voltage is decreased, data may not be correctly read out from the data memory portion. The data memory portion stores, for example, desired mode setting data corresponding to a plurality of product types to determine the type of product. For this reason, high precision is required for the reading of data from the data memory portion.

It is the second object of the present invention to read out data from the data memory portion at high precision even if the power supply voltage is decreased.

To achieve the second object, according to the present invention, data is read out from the data memory portion at a boosted voltage higher than the power supply voltage.

That is, in the present invention, data is read out from the data memory portion at the boosted voltage higher than the power supply voltage. With this setting, even if the data memory portion stores data using a nonvolatile memory cell, the data read precision is increased by increasing the difference between the threshold voltage of the nonvolatile memory cell in an "ON" state, and the voltage of the control gate.

When the power supply voltage becomes low, it may happen that the internal power supply voltage is not high enough to operate the data storage section in a reliable manner, particularly when the system is turned on. The data storage section stores desirable mode setting data corresponding to products of a plurality of types, and the type of a product is determined on the basis of the mode setting data. Therefore, the data storage section must be operated as soon as the system is turned on. The data storage section must be reliably operated even when the internal power supply voltage is not very high, such as the time when the system has just been turned on.

It is the third object of the present invention to correctly operate the data memory portion upon, particularly, power-on.

To achieve the third object, in the present invention, a circuit for detecting the voltage of the internal power supply and outputting a signal representing that the voltage of the internal power supply increases to a voltage high enough to correctly operate the data memory portion is arranged within the chip. The operation of the data memory portion is enabled by a signal from this circuit.

In other words, in the present invention, the data memory portion is operated only when the voltage of the internal power supply increases to a voltage high enough to correctly operate the data memory portion. As a result, the data memory portion correctly operates upon, particularly, power-on.

The data memory portion stores, for example, desired mode setting data corresponding to a plurality of product types. Therefore, the data memory portion must have high reliability and good durability. When the data memory portion is mounted on a semiconductor memory device chip, its durability must be equal to or higher than that of a memory cell array.

It is the fourth object of the present invention to increase the durability of the data memory portion.

To achieve the fourth object, in the first embodiment of the present invention, the data memory portion comprises a nonvolatile memory cell for storing, for example, mode setting data, a latch circuit for latching the data of the nonvolatile memory cell and outputting, for example, a mode signal, and a switch for connecting the latch circuit and the nonvolatile memory cell to each other in reading out, for example, the mode setting data from the nonvolatile memory cell, and disconnecting the latch circuit from the nonvolatile memory cell after, for example, the mode setting data is latched by the latch circuit.

More specifically, in the present invention, after, for example, the mode setting data read out from the nonvolatile memory cell is latched by the latch circuit, the latch circuit and the nonvolatile memory cell are disconnected from each other by the switch to suppress an electrical stress applied to the nonvolatile memory cell. This arrangement increases the durability of the data memory portion.

If a voltage between the gate of the nonvolatile memory cell and a substrate, and a voltage between the source and drain are decreased, an electrical stress applied to the nonvolatile memory cell is further suppressed.

When the data memory portion is constituted including the nonvolatile memory cell, the data memory portion requires the same micro-lithography technique as that applied to the memory cell array of a nonvolatile semiconductor memory device in order to further suppress an increase in chip area.

It is the fifth object of the present invention to micro-pattern the data memory portion constituted including the nonvolatile memory cell.

To achieve the fifth object, according to the present invention, an array in which nonvolatile memory cells are arranged is formed and sandwiched between arrays in which dummy nonvolatile memory cells are arranged.

More specifically, in the present invention, by sandwiching the array in which the nonvolatile memory cells are arranged between the arrays in which the dummy nonvolatile memory cells are arranged, the array having the nonvolatile memory cells can be prevented from being an isolated pattern on the chip. Accordingly, the data memory portion constituted using the nonvolatile memory cell can be formed by the most advanced micro-lithography capable of forming a finer pattern as an interference phenomenon of light becomes more conspicuous.

In the data memory portion, various data including defective address data, and redundancy data such as data for activating a spare decoder (to be described later) can be stored in addition to desired mode setting data corresponding to a plurality of product types. Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram of a circuit for generating signals Add and /Add;

FIG. 5 is a table showing the potential relationship in a write, erase, and read with respect to a nonvolatile transistor; FIG. 6A is a conceptual view in writing data in the nonvolatile transistor; FIG. 6B is a conceptual view in erasing data from the nonvolatile transistor;

FIG. 26 is a waveform chart showing the operation of a data read/latch sequence according to the fifth embodiment of the present invention;

DETAILED DESCRIPTION OF THE INVENTION

Embodiments of the present invention will be described below with reference to the several views of the accompanying drawing.

First Embodiment

Figure 1:
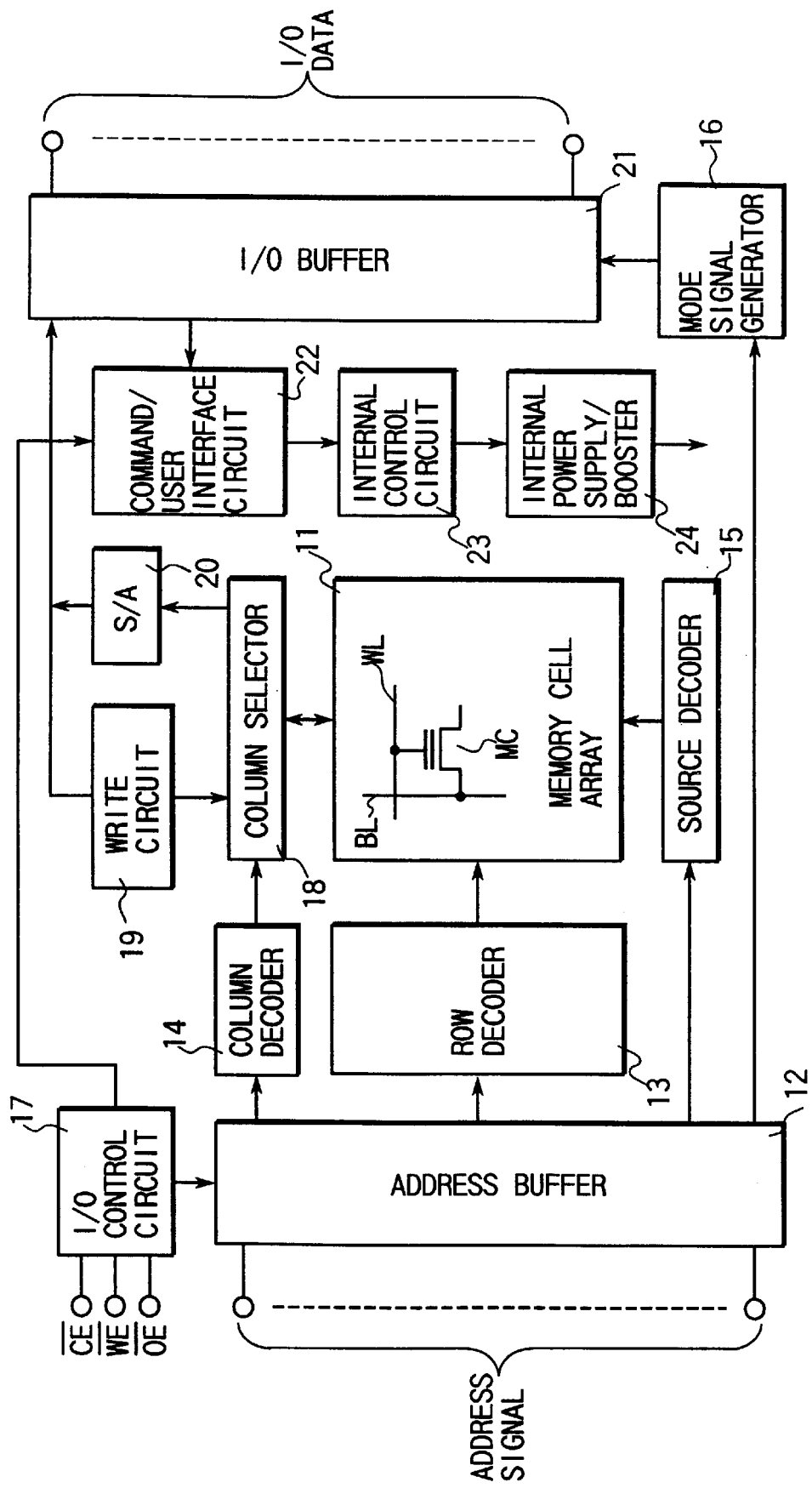
FIG. 1 is a block diagram showing the arrangement of a chip when the present invention is applied to a nonvolatile semiconductor memory.

FIG. 1 is a block diagram showing an example of the internal arrangement of a chip when the present invention is applied to a nonvolatile semiconductor memory.

In FIG. 1, a memory cell array 11 comprises pluralities of bit lines BL and word lines WL (only one bit line BL and one word line WL are shown), and a plurality of memory cells (flash cells; only one of them is shown) MC, each of which has a floating gate, a control gate, and a source and drain, and in which data is programmed (written) upon a change in threshold voltage viewed from the control gate by injecting electrons into the floating gate, and data is electrically erased. The control gate of each memory cell MC is connected to one of the plurality of word lines WL, and its drain is connected to one of the plurality of bit lines BL. The source of each memory cell MC is connected to a common source line (not shown) in units of bit lines, word lines, or blocks.

An address buffer 12 receives an external address signal to generate an internal address signal. The internal address signal generated by the address buffer 12 is supplied to a row decoder 13, a column decoder 14, a source decoder 15, and a mode signal generator 16.

An I/O control circuit 17 receives a chip enable signal /CE, a write enable signal /WE, and an output enable signal /OE which are externally input, and generates various control signals for controlling the operations of internal circuits on the basis of these input signals. For example, a control signal based on the chip enable signal /CE is supplied to the address buffer 12, which is allowed to generate an internal address signal on the basis of this control signal. A control signal based on the output enable signal /OE is supplied to an I/O buffer (to be described later), which is allowed to output data on the basis of this control signal. A control signal based on the write enable signal /WE is supplied to a write circuit (to be described later), which is allowed to write data on the basis of this control signal.

The row decoder 13 selects a word line WL in the memory cell array 11 on the basis of the internal address signal (internal row address signal).

A column selector 18 selects a bit line BL in the memory cell array 11 on the basis of a decoded output from the column decoder 14.

The source decoder 15 selects a source line in the memory cell array 11 on the basis of the internal address signal, and applies a predetermined voltage to the selected source line.

In writing data, a write circuit 19 supplies write data to a selected memory cell in the memory cell array 11 to write the data.

In reading out data, a sense amplifier (S/A) 20 senses data read out from a selected memory cell in the memory cell array 11.

An I/O buffer 21 sends externally supplied data to the write circuit 19 in writing data, and externally outputs data sensed by the sense amplifier (S/A) 20 in reading out data. The I/O buffer 21 receives command data for setting various operation modes, i.e., data write, erase, and read modes, and a product mode in developing the types of mode products.

The I/O buffer 21 is connected to a command/user interface circuit 22. A control signal output from the I/O control circuit 17 is also input to the command/user interface circuit 22. At a timing when the write enable signal /WE is activated, the command/user interface circuit 22 receives command data input through the I/O buffer 21. An output from the command/user interface circuit 22 is supplied to an internal control circuit 23. The internal control circuit 23 generates an internal control signal in accordance with the command data received by the command/user interface circuit 22. This internal control signal is supplied to an internal power supply/booster 24.

The internal power supply/booster 24 receives an external voltage, and generates an internal voltage from the external voltage, or a boosted voltage using a charge pump on the basis of the internal control signal. The internal voltage/ boosted voltage generated by the internal power supply/ booster 24 is distributed to each circuit on the same chip.

The mode signal generator 16 comprises a plurality of nonvolatile transistors, each of which has floating and control gates, and in which data is programmed upon a change in threshold voltage viewed from the control gate by injecting electrons into the floating gate, and data is electrically erased, similar to the memory cell. Mode setting data is written in each nonvolatile transistor of the mode signal generator 16 in a wafer state upon completion of processing in a clean room generally called postprocessing, or in a step upon assembling. Examples of this mode setting data are (1) data used when the layout of pads depends on a package such as TSOP/SOP, and the locations of pads to be used are switched, (2) data used when parallel data have different bit lengths such as ×4, ×8, and ×16, and the numbers of I/O blocks and sense amplifiers to be activated change in accordance with a bit length, and (3) data used when addressing changes such that the top and bottom of an address for designating an irregular block are switched in an irregular-block product in a flash EEPROM. The mode signal generator 16 reads out mode setting data stored in the nonvolatile transistors at a predetermined timing, and generates a mode signal on the basis of the read data. The generated mode signal is supplied to, e.g., the I/O buffer 21.

Figure 2:
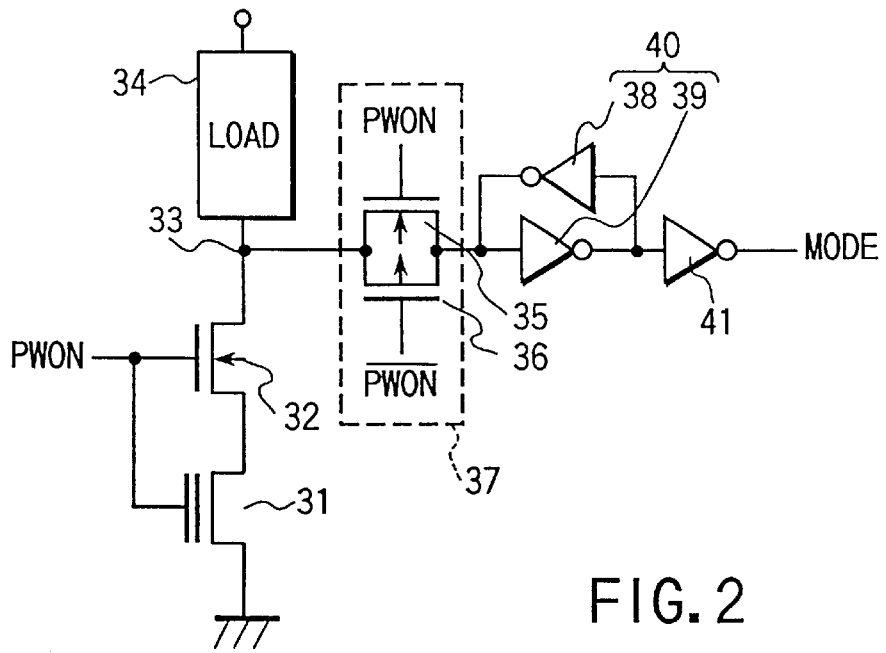
FIG. 2 is a circuit diagram of a mode signal generator.

FIG. 2 shows a detailed circuit arrangement of a part related to the nonvolatile transistor storing one mode setting data in the mode signal generator 16 in FIG. 1.

As shown in FIG. 2, in a nonvolatile transistor 31 having floating and control gates, data is programmed upon a change in threshold voltage viewed from the control gate by injecting electrons into the floating gate. The source of the nonvolatile transistor 31 is grounded, and its drain is coupled to a node 33 via an N-channel MOS transistor 32. The control gate of the nonvolatile transistor 31 and the gate of the transistor 32 are commonly connected. The common gate receives a control signal PWON which changes to "H"level within a predetermined period after the power supply voltage is supplied to the whole chip. A circuit for generating the control signal PWON is a well-known power-on clear signal generator or the like, and a detailed description thereof will be omitted.

A load element 34 made up of, e.g., a P-channel MOS transistor is connected between the node 33 and the power supply voltage. One terminal of a CMOS transmission gate 37 made up of an N-channel MOS transistor 35 and a P-channel MOS transistor 36 is connected to the node 33. The control signal PWON is supplied to the gate of the N-channel MOS transistor 35, whereas a control signal /PWON complementary in level to the signal PWON is supplied to the gate of the P-channel MOS transistor 36. The other terminal of the transmission gate 37 is connected to one terminal of a latch circuit 40 made up of two inverters 38 and 39 having I/O terminals reversely parallel-connected to each other. A signal from the other terminal of the latch circuit 40 is input to an inverter 41, and an output signal from the inverter 41 is supplied as a mode signal MODE to the I/O buffer 21.

Figure 3:
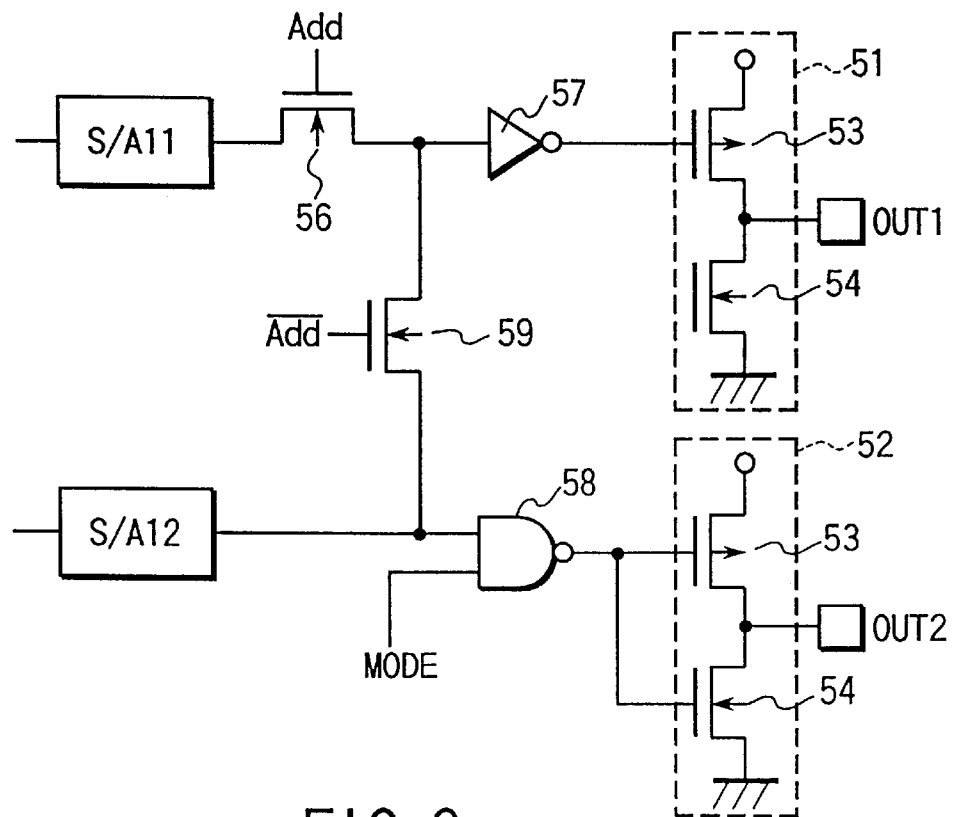
FIG. 3 is a circuit diagram of a sense amplifier circuit and an I/O buffer.

FIG. 3 shows the arrangement of part of the sense amplifier 20 and the I/O buffer 21 when the I/O buffer 21 in FIG. 1 can select either mode "x1" or mode "x2"in reading out data. FIG. 4 shows a circuit for generating signals Add and /Add used in FIG. 3.

In FIG. 3, reference symbols S/A11 and S/A12 denote sense amplifiers each arranged in the sense amplifier 20 to sense 1-bit data. Reference numerals 51 and 52 denote output buffers each for outputting 1-bit data. Each of the output buffers 51 and 52 is constituted by a P-channel MOS transistor 53 having a source connected to the power supply voltage, and an N-channel MOS transistor 54 having a drain connected to the drain of the transistor 53 and a grounded source. Each of output pads OUT1 and OUT2 is connected to the common drain of the transistors 53 and 54 in each of the output buffers 51 and 52.

An output from one sense amplifier S/A11 is supplied to one output buffer 51 via an N-channel MOS transistor 56 and an interver 57. An output from the other sense amplifier S/A12 is supplied to one input terminal of a NAND gate 58. An output from the NAND gate 58 is supplied to the other output buffer 52. An N-channel MOS transistor 59 is connected between the input terminal of the interver 57 and one input terminal of the NAND gate 58. The other input terminal of the NAND gate 58 receives the mode signal MODE generated by the circuit in FIG. 2. The gate of the transistor 56 receives the address signal Add, while the gate of the transistor 59 receives the address signal /Add complementary in level to the address signal Add.

FIG. 4 shows a detailed arrangement of a circuit portion for generating the complementary address signals Add and /Add used in the circuit of FIG. 3. In this circuit, a 1-bit internal address signal AddIN generated by the address buffer 12 (shown in FIG. 1) is supplied to one input terminal of a NOR gate 61. The mode signal MODE is supplied to the other input terminal of the NOR gate 61. An output from the NOR gate 61 is supplied to an inverter 62, and an output from the inverter 62 is supplied as the signal Add to the gate of the transistor 56 in FIG. 3. The output from the inverter 62 is further supplied to an inverter 63, and an output from the inverter 63 is supplied as the signal /Add to the gate of the transistor 59 in FIG. 3.

The circuit shown in FIG. 4 is arranged in the mode signal generator 16 in the first embodiment, but may be arranged outside the mode signal generator 16 or in another circuit.

Nonvolatile semiconductor memory chips each having the respective circuits are simultaneously manufactured using completely the same mask set regardless of different mode types wherein I/O buffers 21 read out data in modes "x1" and "x2". In a wafer state upon completion of processing in a clean room called postprocessing, or in a step upon assembling, mode setting data is written in the nonvolatile transistor 31 in the circuit of FIG. 2. For example, in the first embodiment, electrons are injected into the floating gate in order to set the nonvolatile transistor in mode "x2", whereas no electron is injected in order to set it in mode "x1".

When the user uses a nonvolatile semiconductor memory chip programmed in this manner upon incorporating it in a system, if the power supply voltage is applied to the chip, the control signal PWON changes to "H" level within a predetermined period to turn on the transistor 32 in FIG. 2 and read out memory data from the nonvolatile transistor 31 to the node 33.

When data corresponding to mode "x2" in which electrons are injected into the floating gate in advance is stored in the nonvolatile transistor 31, the nonvolatile transistor 31 is not turned on because its threshold voltage has gone high. Therefore, the node 33 changes to "H" level. Since the control signal /PWON is at "L" level for an "H"-level control signal PWON, the transmission gate 37 in FIG. 2 is turned on to transmit the "H"-level signal of the node 33 to the latch circuit 40. After the control signals PWON and /PWON respectively return to "L" level and "H"-level, the latch circuit 40 holds this state. That is, in mode "x2", the circuit in FIG. 2 outputs an "H"-level mode signal MODE.

When data corresponding to mode "x1" in which no electron is injected into the floating gate is stored in the nonvolatile transistor 31, its threshold voltage remains low. If the "H"-level control signal PWON is supplied to the control gate, the nonvolatile transistor 31 is turned on. Accordingly, the node 33 changes to "L" level. That is, in mode "x1", the circuit in FIG. 2 outputs an "L"-level mode signal MODE.

In the circuit of FIG. 3, in mode "x2", the NAND gate 58 operates as an inverter because the mode signal MODE is at "H" level. At this time, since the signal Add supplied the gate of the transistor 56 is at "H" level, and the signal /Add supplied to the gate of the transistor 59 is at "L" level, the transistor 56 is turned on, and the transistor 59 is turned off. As a result, data sensed by the two sense amplifiers S/A11 and S/A12 are output parallel from the output pads OUT1 and OUT2 via the output buffers 51 and 52.

In mode "x1", since the mode signal MODE is at "L" level, an output from the NAND gate 58 is always at "H" level regardless of an output from the sense amplifier S/A12. Both the P-channel MOS transistor 53 and the N-channel MOS transistor 54 in the output buffer 52 are kept off, and the output pad OUT2 is in a highimpedance state.

In accordance with an input address at that time, either one of the signals Add and /Add changes to "H" level, and the other to "L" level. If Add="H" level and /Add="L" level, the transistor 56 is turned on, and data sensed by the sense amplifier S/A11 is output from the output pad OUT1 via the output buffer 51. If Add="L" level and /Add="H" level, the transistor 59 is turned on, and data sensed by the sense amplifier S/A12 is output from the output pad OUT1 via the output buffer 51. That is, in mode "x1", 2-bit data sensed by the sense amplifiers S/A11 and S/A12 are output from one output pad OUT1 in accordance with an address state at that time.

In the circuit of FIG. 4, in mode "x2", since the mode signal MODE is at "H" level, an output from the NOR gate 61 is at "L" level regardless of the input address signal AddIN, and the signals Add and /Add are respectively at "H" level and "L" level, as described above. In mode "x1", since the mode signal MODE is at "L" level, an output from the NOR gate 61 changes in accordance with the input address signal AddIN. The output changes to "H" level for an "L"-level input address signal AddIN, and to "L" level for an "H"-level input address signal AddIN. The signals Add and /Add change depending on the input address signal AddIN.

In this way, a nonvolatile memory element is arranged within a chip, data about a mode of the integrated circuit is written in the nonvolatile memory element in postprocessing, and this memory data is read out to generate a mode signal. With this arrangement, the conventional problems of cumbersome management of many masks and an increase in chip area can be solved. In addition, the mode of the integrated circuit can be switched by rewriting the data of the nonvolatile memory element even upon completion of assembling. Accordingly, the manufacturing efficiency greatly increases because the integrated circuit manufacturer can make production scheduling without considering the final number of products for each mode, and can simultaneously manufacture a plurality of products having different modes up to an assembling step.

The description does not exemplify any detailed arrangement for programming/erasing data in/from the nonvolatile transistor. Programming/erase of data in from the nonvolatile transistor is the same as programming/erase of data in/from the memory cell arranged in the memory cell array 11. FIG. 5 summarizes the respective potential relationships of the control gate (Vg), drain (Vd), and source (Vs) of the nonvolatile transistor in a write (electron injection), an erase (electron discharge), and a read.

FIG. 6A is a conceptual view in writing data in the nonvolatile transistor. A booster 71 boosts an external voltage to generate a plurality of voltages higher than the power supply voltage. As described above, the mode signal generator 16 in FIG. 1 comprises a plurality of nonvolatile transistors in order to make setting of a plurality of different modes possible. Selecting some of these nonvolatile transistors to write data requires a selecting transistor. This selecting transistor is a transistor 72 in FIG. 6A. More specifically, one of the boosted voltages generated by the booster 71 is applied to the drain of the nonvolatile transistor 31 via the transistor 72. The remaining boosted voltages generated by the booster 71 are supplied to level shifters 73 and 74. Each of the level shifters 73 and 74 level-shifts an "H"-level write signal to a voltage higher than the power supply voltage. Outputs from the two level shifters 73 and 74 are respectively supplied to the gate of the selecting transistor 72 and the control gate of the nonvolatile transistor 31.

In this arrangement, to write data in the nonvolatile transistor 31, 10 V (Vg) and 6 V (Vd) are respectively applied to the control gate and the drain. Note that the source is at 0 V (Vs) because it is grounded.

FIG. 6B is a conceptual view in erasing data from the nonvolatile transistor. A negative-voltage generator 75 generates a voltage having a negative value lower than the ground voltage of 0 V. A booster 76 boosts an external voltage to generate a voltage higher than the power supply voltage. The boosted voltage generated by the booster 76 is applied to the source of the nonvolatile transistor 31. An output from the negative-voltage generator 75 is supplied to the control gate of the nonvolatile transistor 31.

In this arrangement, to erase data from the nonvolatile transistor 31, −7 V (Vg) and 6 V (Vs) are respectively applied to the control gate and the source. Note that the drain is open.

In the description, the difference in bit arrangement in reading out data is described as an example of different modes. However, the example of different modes is not limited to the difference in bit arrangement. For example, when designation of a pad to be used (bonded) depends on different packages, the mode signal is used (1) to activate a circuit connected to the pad to be used, and (2) to ground pads not to be used and inactivate circuits connected to these pads.

The present invention can also be practiced in changing designation of the range of an operating voltage. More specifically, to operate a single integrated circuit at, e.g., 3 V and 5 V, setting of internal timings, the size ratios of various ratio circuits (particularly interfaces), and the like must be separately finely adjusted. They can be switched and controlled using the mode signals.

The present invention can also be applied for switching control of high-speed and largepower-consumption version/ low-speed and small-power-consumption version, or control of a circuit for inverting an address input midway in order to switch the top/bottom boot of a memory block in a NOR flash memory.

The present invention is also applicable to a redundancy technique for a semiconductor memory device such as a flash memory. That is, redundancy data such as defective address data or data for activating a spare decoder can be stored in the nonvolatile transistor 31.

Various applications of the present invention are conceivable. The present invention can be applied to all cases as far as a plurality of different modes can be expressed by circuits with one internal mode signal or a combination of a plurality of internal mode signals.

In the first embodiment, mode setting data and redundancy data are stored in the nonvolatile transistor 31. The mode-signal generator 16 including the nonvolatile transistor 31 generates a mode signal for determining a product type in accordance with the mode setting data, or a redundancy signal for replacing a defective address with a spare in accordance with the redundancy data.

For this reason, the mode signal generator 16 must have high reliability.

Figure 7:
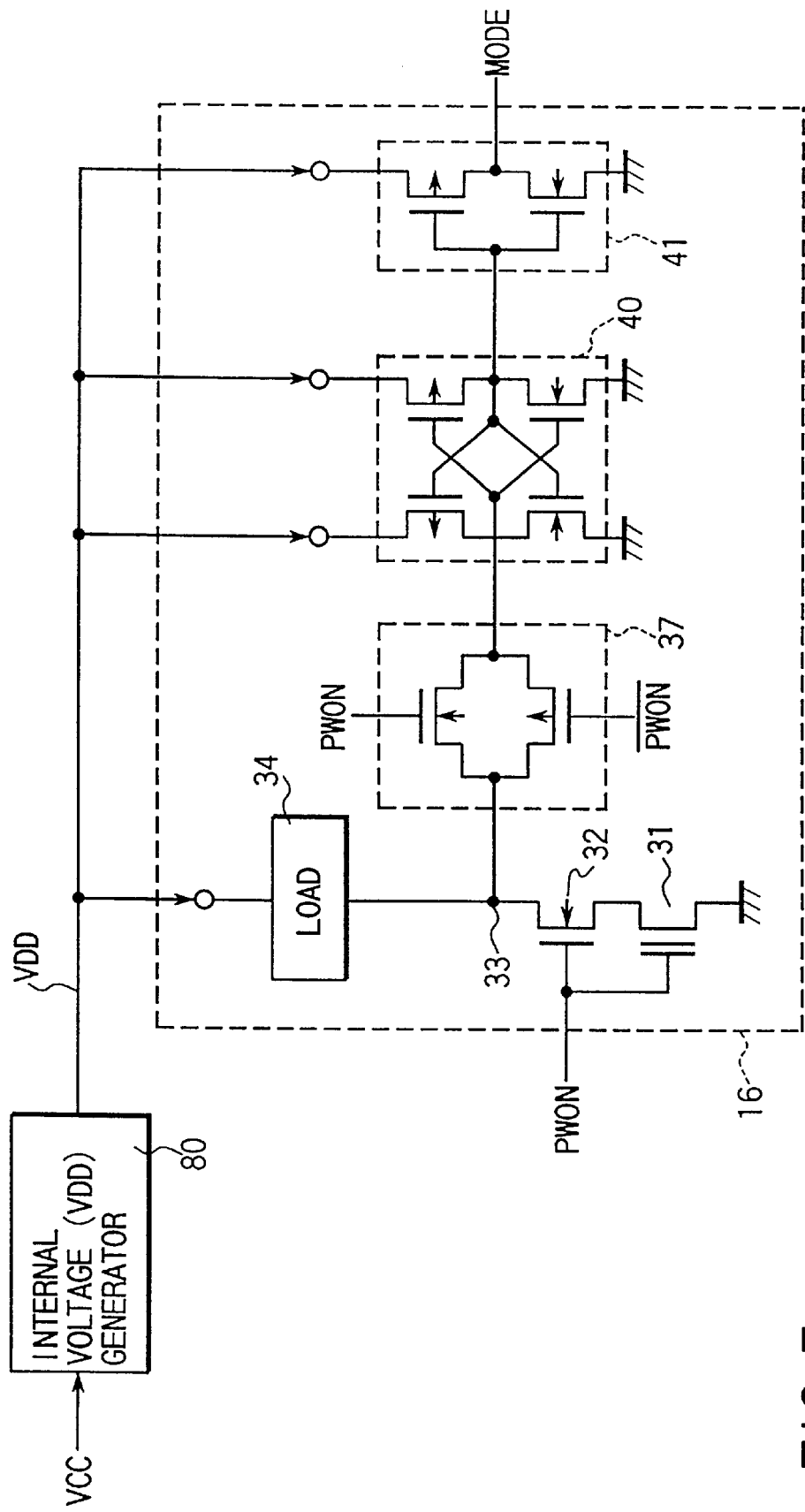
FIG. 7 is a block diagram showing the arrangement of a semiconductor integrated circuit device according to the first embodiment of the present invention.

FIG. 7 is a block diagram showing an example of the arrangement of a semiconductor integrated circuit device according to the first embodiment.

As shown in FIG. 7, an internal voltage VDD boosted higher than an external voltage or regulated equal to/lower than the external voltage by an internal voltage generator 80 is used as the power supply of a mode signal generator 16. The internal voltage generator 80 generates the internal voltage VDD from, e.g., the external voltage VCC.

In this manner, the power supply of the mode signal generator 16 is changed from the external voltage VCC to the power supply terminal VDD. This can suppress any malfunction caused by fluctuations in the external voltage VCC or the like. As a result, the reliability of the mode signal generator 16 increases.

Second Embodiment

In a circuit having many analog elements, e.g., a circuit wherein data is read out from a nonvolatile transistor 31, the power supply margin is often smaller than that of a general CMOS logic circuit.

Particularly when the internal voltage VDD shown in FIG. 7 is decreased to encourage micropatterning of a device, the circuit having many analog elements becomes short of the power supply margin. This will be explained by exemplifying the memory cell MC of the flash EEPROM shown in FIG. 1.

Figure 8A:
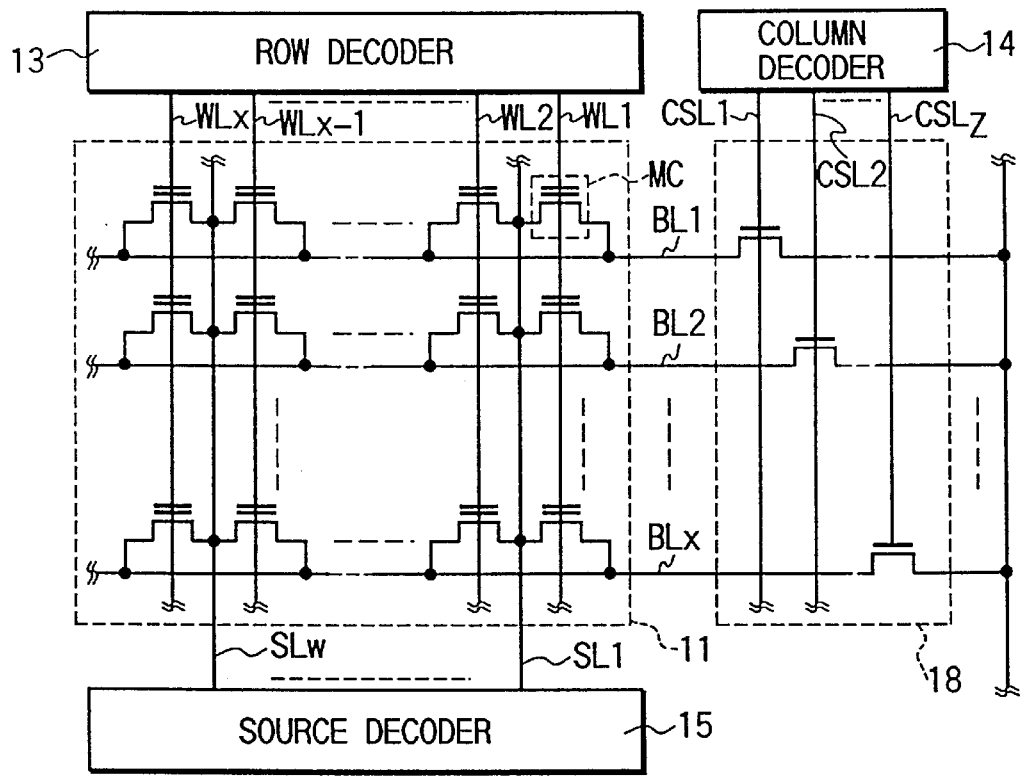
FIG. 8A is a circuit diagram of a memory cell array.
Figure 8B:
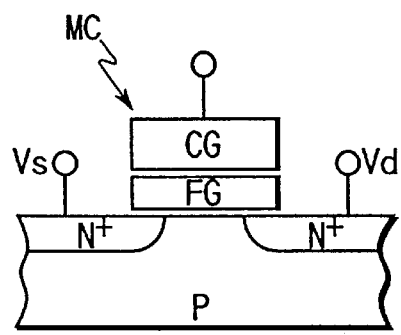
FIG. 8B is a sectional view of a memory cell.
Figure 8C:
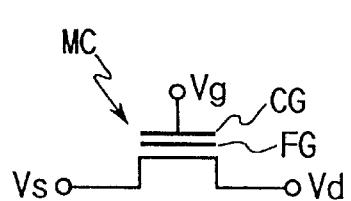
FIG. 8C is a symbol diagram of the memory cell.
Figure 8D:
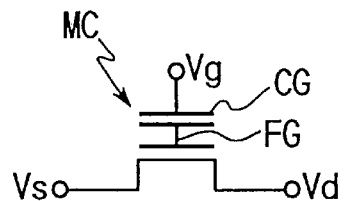
FIG. 8D is an equivalent circuit diagram of the memory cell.

FIG. 8A is a circuit diagram of a memory cell array 11. FIG. 8B is a sectional view of a memory cell MC. FIG. 8C is a circuit diagram showing symbols in the memory cell MC. FIG. 8D is an equivalent circuit diagram of the memory cell MC.

Data is written/erased in/from the memory cell MC by injecting/discharging electrons into/from a floating gate FG.

While electrons exist in the floating gate FG, the threshold voltage Vthcell viewed from a control gate CG is high, and the memory cell MC is in an "OFF" state.

If no electron exists, the threshold voltage Vthcell viewed from the control gate CG is low, and the memory cell MC is in an "ON" state. The threshold voltage Vthcell in an "ON" state is generally about 2 V.

The power supply voltage of a conventional flash EEPROM is generally 5 V, which is directly applied to the control gate CG in a read. The cell current Icell is proportional to $Vd-(1/2)\cdot Vd^2$ (the voltage Vd is a drain voltage and holds Vd=Vg−Vthcell for an N-channel memory cell MC, and the voltage Vg is a control gate voltage).

When the memory cell MC is of an N-channel type, the threshold voltage Vthcell is 2 V, and the control gate voltage Vg is 5 V, the drain voltage Vd is 3 V (=Vg−Vthcell), and a satisfactory cell current Icell can be obtained.

However, if the external power supply voltage VCC or the internal power supply voltage VDD is lowered to 3 V or so and this lowered power supply voltage is applied directly to the control gate of a memory cell at the time of reading, the voltage Vg at the control gate is 3 V, and voltage Vd at the drain is 1 V (=Vg −Vthcell). For this reason, no satisfactory cell current Icell can be obtained.

When the signal PWON changes to "H" level in the mode signal generator 16 shown in FIG. 2, latch data of the latch circuit 40 is determined by the current ratio of the load 34 to the nonvolatile transistor 31.

In the circuit shown in FIG. 2, the signal PWON having the amplitude of the power supply voltage is supplied to the control gate of the nonvolatile transistor 31. This technique is effective when the power supply voltage and the threshold voltage Vthcell of the nonvolatile transistor 31 in an "ON" state have a sufficient difference.

When the power supply voltage is decreased to shorten the difference between the power supply voltage and the threshold voltage Vthcell of the nonvolatile transistor 31, the same phenomenon as that described with reference to FIGS. 8A to 8D occurs, and the cell current runs short.

If the power supply voltage fluctuates in the case of a small difference between the power supply voltage and the threshold voltage Vthcell, the nonvolatile transistor 31 in an "ON" state may be turned off, and the mode signal generator 16 may output an erroneous mode signal MODE. If the erroneous mode signal MODE is output, the type of produce changes.

To eliminate such an error, e.g., the power supply margin is set tighter.

However, setting a tight power supply margin may undesirably lead to a decrease in manufacturing yield and the like.

An object of the second embodiment is therefore to maintain satisfactory reliability of a mode signal generator 16 without decreasing, e.g., the manufacturing yield even if the difference between the power supply voltage and the threshold voltage Vthcell of a nonvolatile transistor 31 in an "ON" state becomes smaller.

Figure 9:
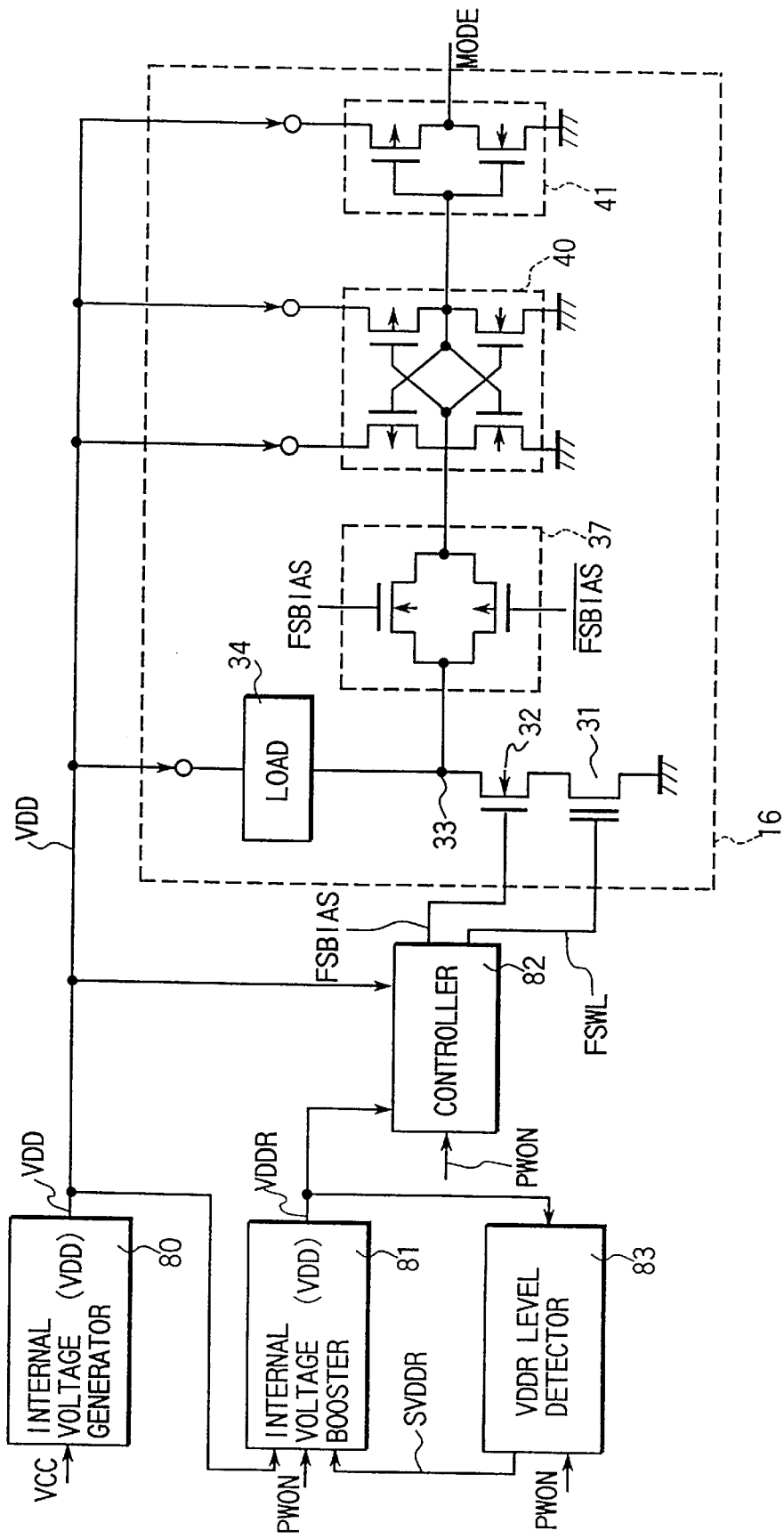
FIG. 9 is a block diagram showing the arrangement of a semiconductor integrated circuit device according to the second embodiment of the present invention.

FIG. 9 is a block diagram showing an example of the arrangement of a semiconductor integrated circuit device according to the second embodiment.

As shown in FIG. 9, in the second embodiment, an internal voltage booster 81 for boosting the internal voltage VDD to a boosted voltage VDDR is arranged within a chip. The boosted voltage VDDR is applied to a controller 82 together with the internal voltage VDD. The controller 82 outputs a signal FSWL to be supplied to the control gate of the nonvolatile transistor 31 and a signal FSBIAS to be supplied to the gate of a transistor 32 or the like in accordance with a signal PWON. The signal FSBIAS has the amplitude of the internal voltage VDD, and the signal FSWL has the amplitude of the boosted voltage VDDR.

In this manner, the signal FSWL to be supplied to the control gate of the nonvolatile transistor 31 is set to have the boosted voltage VDDR higher than the internal voltage VDD. This setting can increase the difference between the power supply voltage and the threshold voltage Vthcell of the nonvolatile transistor 31 in an "ON" state. Even if the internal voltage VDD slightly fluctuates, the nonvolatile transistor 31 in an "ON" state can be prevented from being turned off.

The second embodiment adopts the internal voltage VDD, but may use the external voltage VCC in place of the internal voltage VDD. In this case, the boosted voltage VDDR is obtained by boosting the external voltage VCC.

An example of the voltage of the signal FSBIAS is about 3 V, and an example of the voltage of the signal FSWL is about 5 V. That is, in the third embodiment, an example of the internal voltage VDD is a bout 3 V, and an example of the boosted voltage VDDR is about 5 V.

As shown in FIG. 9, a detector 83 for detecting the level of the boosted voltage VDDR may be arranged to keep the boosted voltage VDDR at a predetermined level (about 5 V in the second embodiment). The detector 83 detects the level of the boosted voltage VDDR, and outputs a signal SVDDR for activating the booster 81 if the boosted voltage VDDR changes lower than the predetermined level, and deactivating it if the boosted voltage VDDR changes higher than the predetermined level.

Al though the detector 83 need not always be arranged, it can particularly prevent the boosted voltage VDDR from being lower than the predetermined level. Accordingly, the situation wherein the boosted voltage VDDR decreases to be closer to the threshold voltage Vthcell of the nonvolatile transistor 31 in an "ON" state can be avoided, and the reliability of the mode signal generator 16 further increases.

Third Embodiment

A read of data from the memory cell MC of the memory cell array 11 shown in FIGS. 8A to 8D does not start at the same time as power-on. This is because data is read out by inputting a read command to a powered chip and inputting an address.

To the contrary, a read of data from the nonvolatile transistor 31 of the mode signal generator 16 must start at the same time as power-on in order to confirm the product type of powered chip.

A potential for outputting a signal PWON, i.e., a power-on detection level is set lower than the assurance range of the power supply voltage to avoid a malfunction.

For example, in a product having a power supply voltage of about 3 V, the detection level is set to 2 V. The detection level of 2 V is equal to the threshold voltage (Vthcell=2 V) of the nonvolatile transistor 31 in an "ON" state. In the product having the detection level of 2 V, if the power supply voltage does not reach 3 V but reaches 2 V, the signal PWON changes to "H" level. As a result, the 2-V signal PWON is supplied to the gate of the nonvolatile transistor 31.

The threshold voltage Vthcell of the nonvolatile transistor 31 in an "ON" state is 2 V. At a gate voltage of 2 V, the nonvolatile transistor 31 is kept off, so correct data cannot be read out.

Even in the use of the boosted voltage VDDR, like the second embodiment, if the internal voltage VDD does not reach 3 V, the booster 81 cannot generate any sufficiently boosted voltage VDDR. Accordingly, no correct data may be read-out similar to the above case.

An object of the third embodiment is to correctly operate a mode signal generator 16 upon power-on.

For this purpose, in the third embodiment, a controller 82 operates after the boosted voltage VDDR reaches a satisfactory level.

Figure 10:
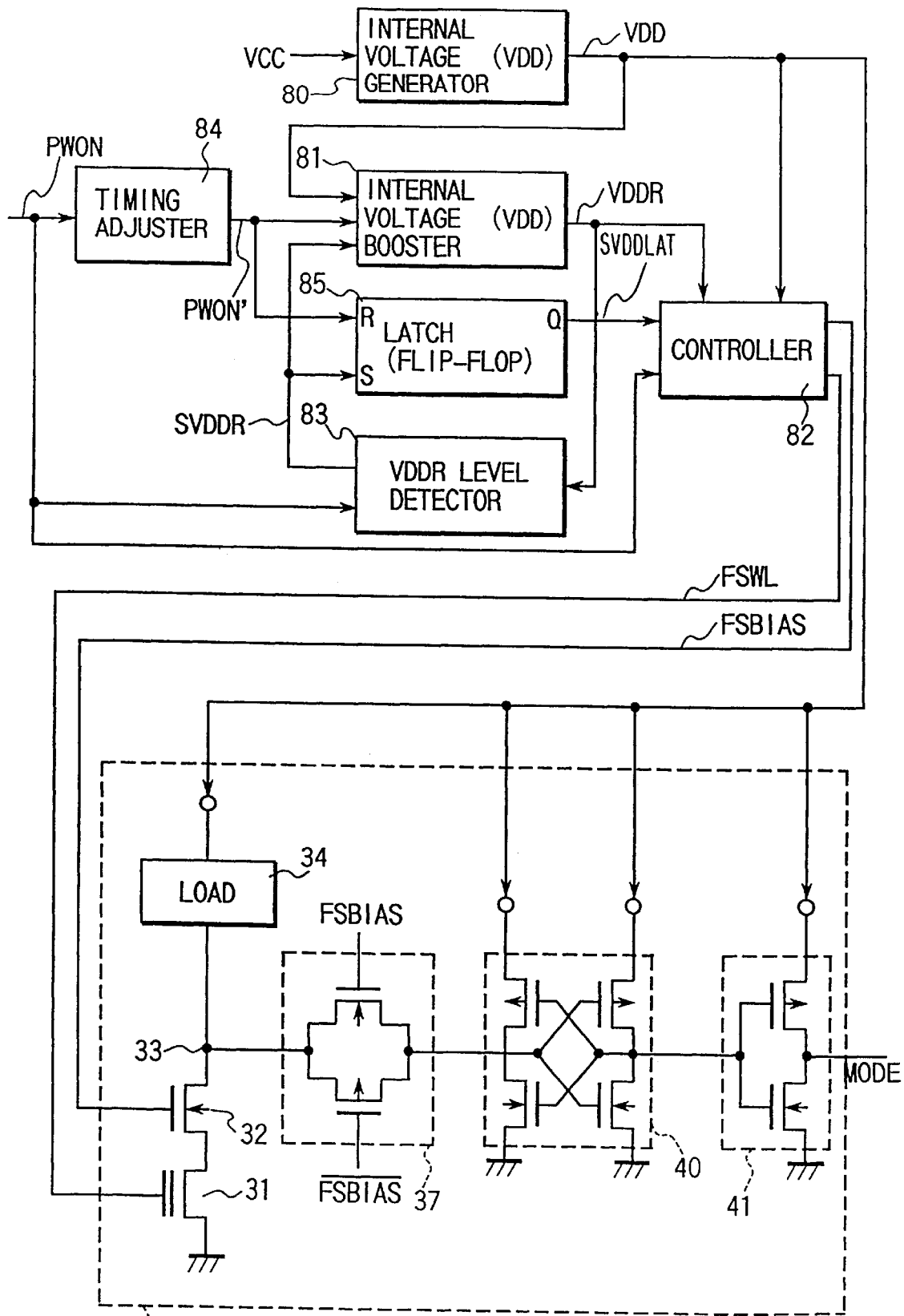
FIG. 10 is a block diagram showing the arrangement of a semiconductor integrated circuit device according to the third embodiment of the present invention.

FIG. 10 is a block diagram showing an example of the arrangement of a semiconductor integrated circuit device according to the third embodiment.

As shown in FIG. 10, the third embodiment employs a timing adjuster 84 for delaying the rise of the signal PWON by a time required to change the level of the external voltage VCC or internal voltage VDD to a set voltage (e.g., 3 V). The operation of a booster 81 is enabled by a signal PWON' from the timing adjuster 84. After the level of the internal voltage VDD reaches the set voltage (e.g., 3 V), the booster 81 operates to generate the boosted voltage VDDR.

The third embodiment further adopts a latch circuit (flip-flop) 85 reset by the signal PWON' and set by the signal SVDDR. The latch circuit 85 outputs a signal SVDDLAT representing that the level of the boosted voltage VDDR reaches the set voltage (e.g., 5 V). The operation of the controller 82 is enabled by the signal SVDDLAT.

As described above, the operation of the controller 82 is enabled by the signal SVDDLAT representing that the level of the boosted voltage VDDR reaches the set voltage (e.g., 5 V). With this setting, the controller 82 operates after the boosted voltage VDDR reaches a satisfactory level. The "H" level of the signal FSWL can be set sufficiently higher than the level of the threshold voltage Vthcell of a nonvolatile transistor 31 in an "ON" state. Even if data is read out from the nonvolatile transistor 31 at the same time as power-on of the chip, a read error in which the nonvolatile transistor 31 in an "ON" state is turned off can be suppressed, and the mode signal generator 16 can correctly operate upon power-on.

Fourth Embodiment

A detailed circuit example of a semiconductor integrated circuit device to which the present invention is applied will be described as the fourth embodiment.

Figure 11:
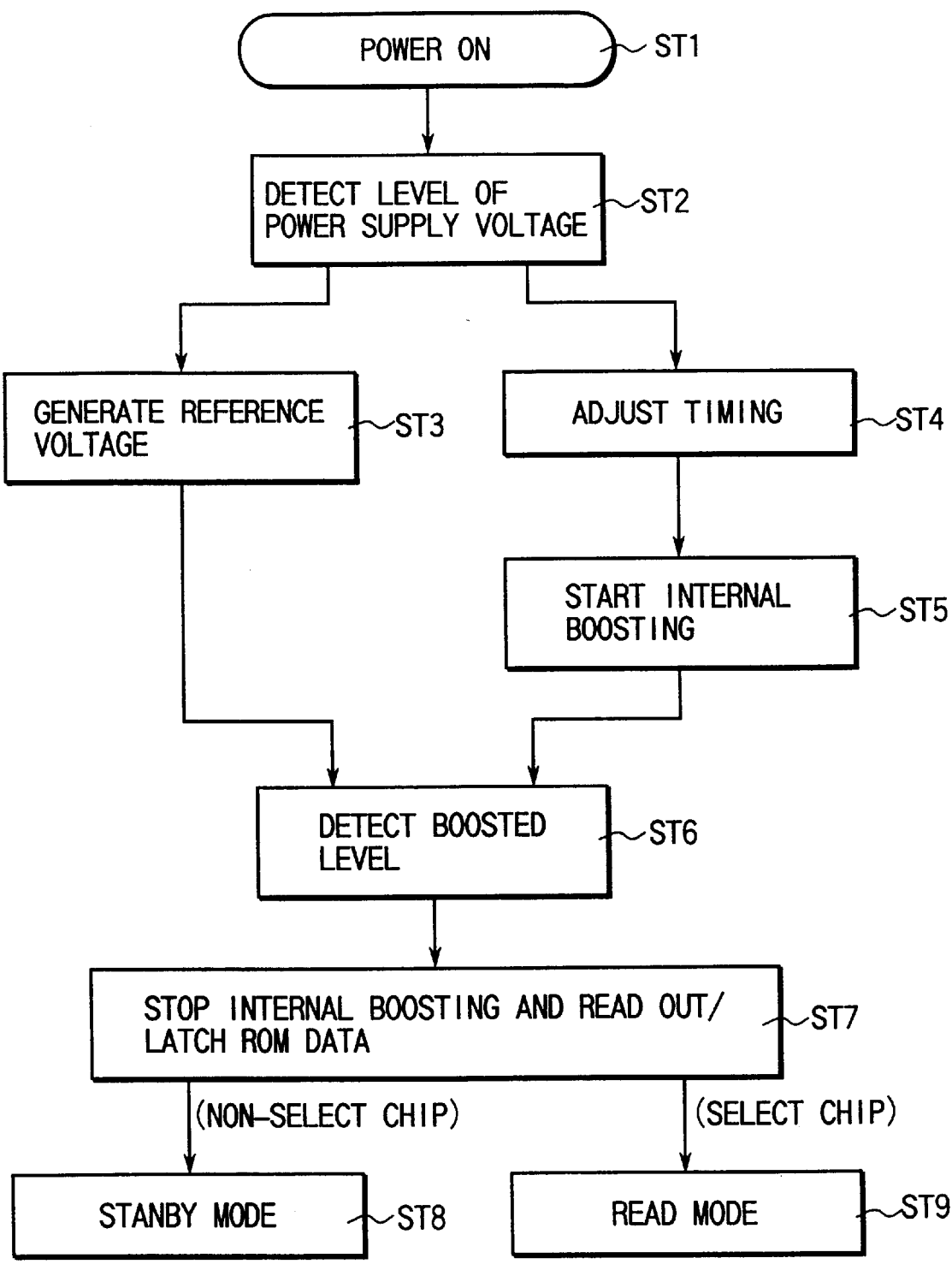
FIG. 11 is a flow chart showing the control sequence of a flash EEPROM according to the fourth embodiment of the present invention.
Figure 12:
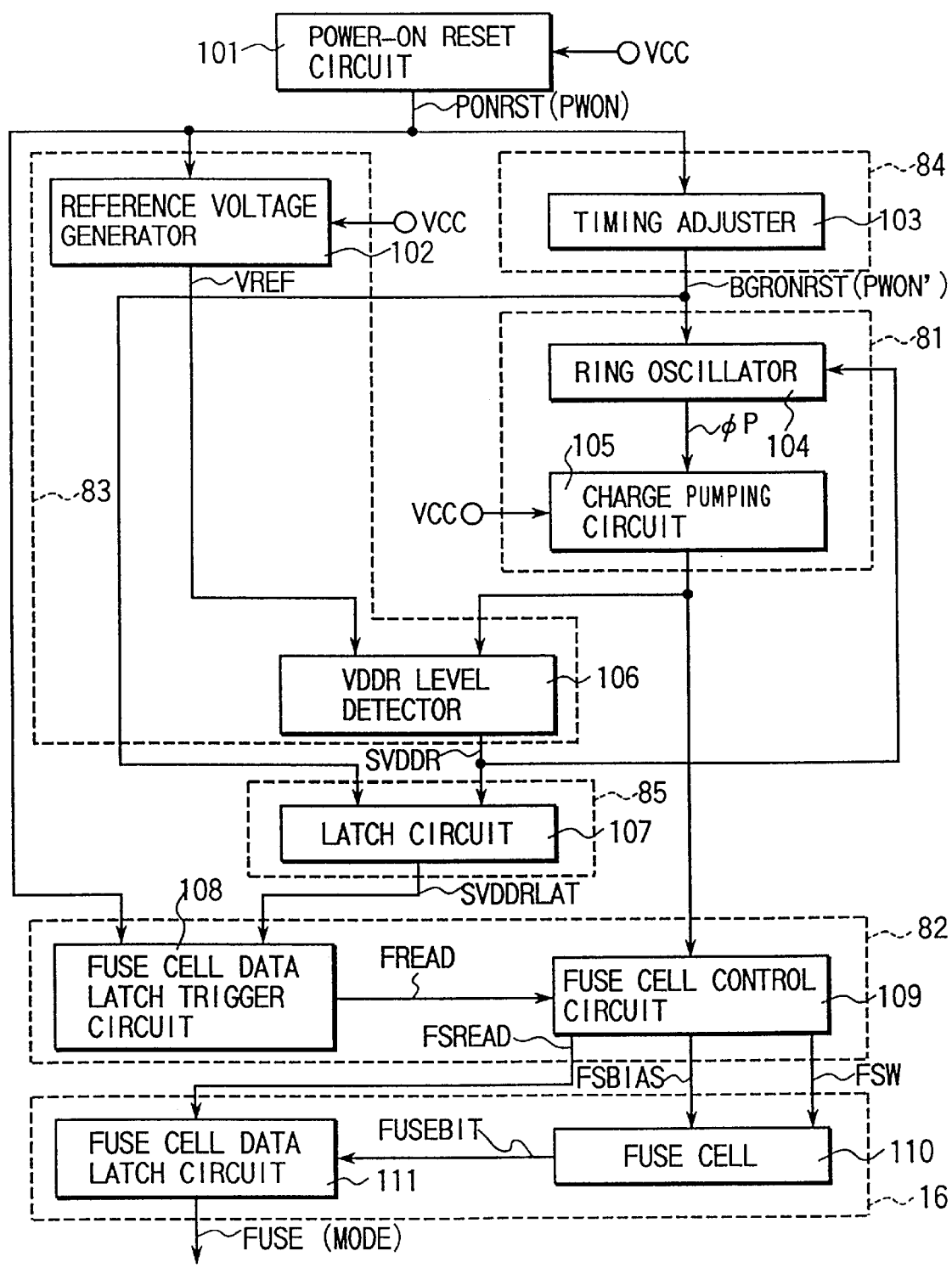
FIG. 12 is a block diagram of the arrangement of the flash EEPROM according to the fourth embodiment of the present invention.

FIG. 11 is a flow chart showing an example of the control sequence of a flash EEPROM according to the fourth embodiment of the present invention. FIG. 12 is a block diagram of an example of the arrangement of the flash EEPROM according to the fourth embodiment of the present invention.

Detailed arrangements of circuits of respective blocks will be sequentially explained below in accordance with the control sequence.

In step ST1 shown in FIG. 11, a chip is powered with the power supply voltage (external voltage VCC or the internal voltage VDD; in the fourth embodiment, the external voltage VCC is used). The level of the power supply voltage VCC rises.

In step ST2, the level of the power supply voltage VCC is detected. Detection of the power supply voltage VCC is performed by a power-on reset circuit 101 shown in FIG. 12. The detection level of the power supply voltage VCC must be matched by, of circuits arranged in the flash EEPROM, a circuit having the smallest margin VCCmin. In the fourth embodiment, the detection level of the power supply voltage VCC is matched by a reference voltage generator 102 shown in FIG. 12.

Figure 13:
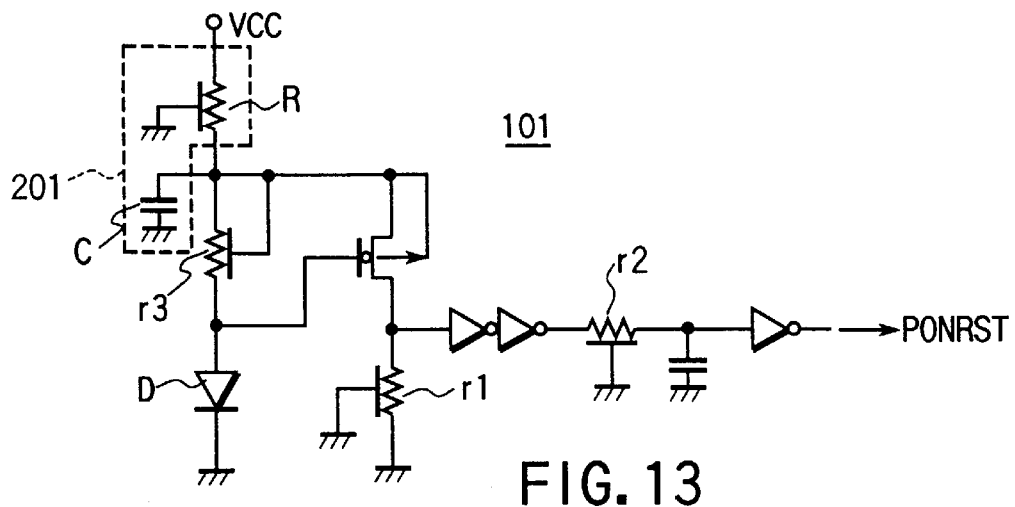
FIG. 13 is a circuit diagram of a power-on reset circuit.

FIG. 13 is a circuit diagram showing an example of the power-on reset circuit 101.

In the power-on reset circuit 101 shown in FIG. 13, a low-pass filter 201 made up of a capacitor C and a resistor R is connected to a power supply terminal VCC in order to prevent a malfunction caused by an abrupt change in voltage VCC (power supply noise).

Diffusion resistors r1 and r2 in the power-on reset circuit 101 are of an n-type in order to prevent a node having a low-speed internal operation from being affected by noise. Each n-type diffusion resistor is formed in a p-type silicon substrate or well, and the p-type substrate or well is biased to the ground potential.

A diffusion resistor r3 series-connected between the power supply terminal VCC and a diode D is of a p-type. The p-type diffusion resistor is formed in an n-type silicon substrate or well, and the n-type substrate or well is biased to, e.g., the voltage VCC.

When the power supply voltage VCC reaches the detection level, the power-on reset circuit 101 outputs an "L"-level detection signal PONRST. The detection signal PONRST is equivalent to, e.g., the signal PWON in the circuit shown in FIG. 10.

After the level of the power supply voltage VCC is detected, a reference voltage VREF is generated in step ST3. The reference voltage VREF is generated by the reference generator 102.

Figure 14:
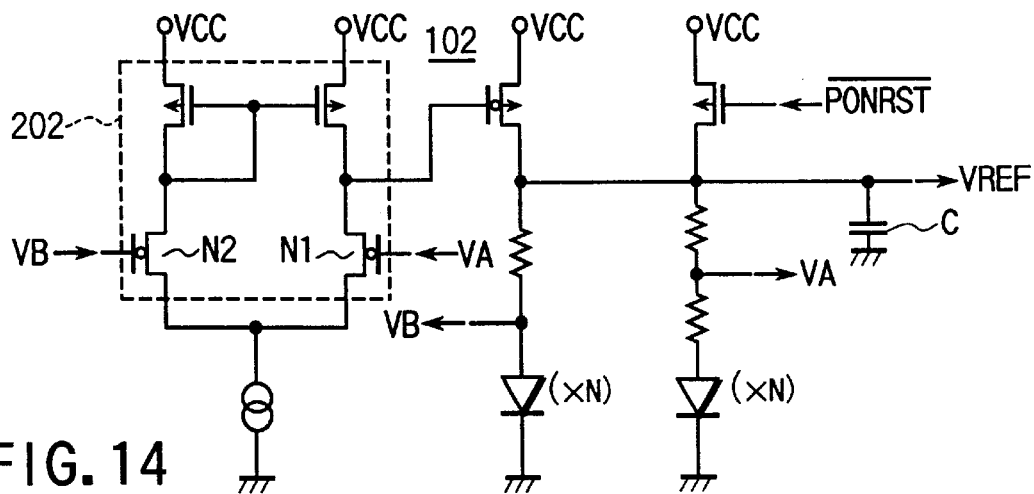
FIG. 14 is a circuit diagram of a reference voltage generator.

FIG. 14 is a circuit diagram showing an example of the reference generator 102.

The reference generator 102 shown in FIG. 14 is a bandgap reference circuit. In the bandgap reference circuit 102, natural transistors are used as N-channel MOS transistors N1 and N2 constituting a current mirror circuit 202. A natural transistor has a threshold voltage of about 0 V, and can be formed by doping no impurity for adjusting the threshold voltage in, e.g., a channel.

The lower limit of the operating voltage of the current mirror circuit 202 shown in FIG. 14 is given by $$VCCmin = VB(=VA) + VTHP$$

where VB is the forward voltage of a PN diode. VTHP is a threshold voltage of P-channel MOS transistor in the current mirror circuit 202.

This can be rewritten as $$VCCmin = VF + VTHP$$

The power-on reset circuit 101 described with reference to FIG. 13 has a voltage detection level VPONRST given by $$VPONRST = VF + VTHP$$

The voltage detection level VPONRST is matched with the lower limit of the operating voltage of the current mirror circuit 202 shown in FIG. 14.

As described above, the bandgap reference circuit 102 generates the reference voltage VREF upon power-on. A capacitor C connected to the output node of the reference voltage VREF is a stabilized capacitor.

The bandgap reference circuit 102 operates even in a standby state in order to keep the boosted voltage VDDR (to be described later) even in a standby state in the fourth embodiment. Considering demands for a reduction in standby current, the current consumption must be suppressed to about several $\mu A$. To reduce the current consumption, the operation speed of the bandgap reference circuit 102 shown in FIG. 14 is set very low. For this reason, stabilization of the reference voltage VREF requires several $\mu s$ to several ten $\mu s$. Therefore, a series of operations which are to be performed inside the chip when the system is turned on, are not executed until the reference voltage VREF becomes stable after an increase in the power supply voltage VCC is sensed. In the fourth embodiment, as shown in step ST4, timing adjustment up to generation of a stable reference voltage VREF is performed parallel to step ST3.

Figure 15:
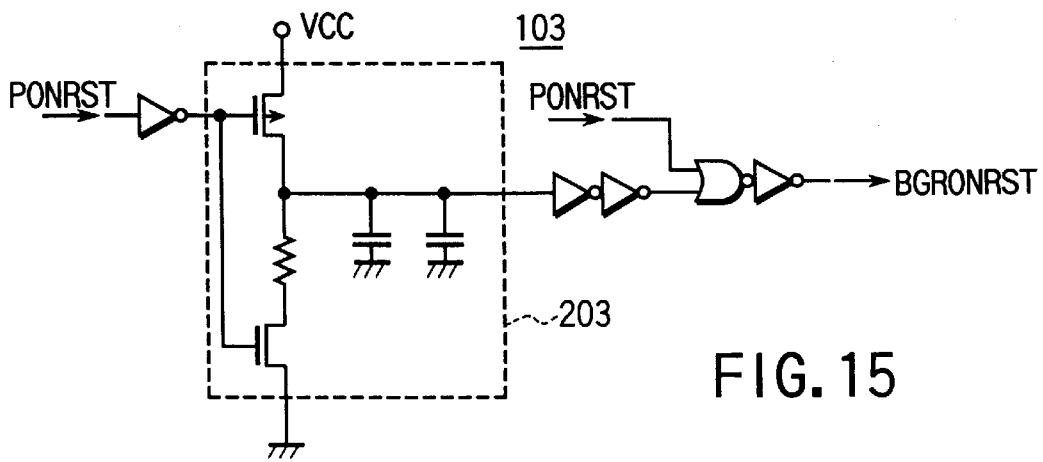
FIG. 15 is a circuit diagram of a timing adjuster.

FIG. 15 is a circuit diagram showing an example of a timing adjuster 103.

The timing adjuster 103 shown in FIG. 15 adjusts the timing until the reference voltage VREF stabilizes after the detection signal PONRST is output. A CR time constant inside the timing adjuster 103 is set larger than the time constant of the bandgap reference circuit 102.

In the timing adjuster 103 shown in FIG. 15, the CR time constant of a first stage 203 is particularly set larger than the time constant of the bandgap reference circuit 102. The timing adjuster 103 outputs a signal BGRONRST representing the timing at which the reference voltage VREF is satisfactorily stabilized.

The signal BGRONRST is at "H" level for an "H"-level detection signal PONRST and at "L" level for an "L"-level detection signal PONRST. Upon the lapse of a time determined by the CR time constant, the signal BGRONRST changes to "L" level.

After the reference voltage VREF stabilizes, the power supply voltage VCC is internally boosted in step ST5. Internal boosting is performed by a ring oscillator 104 for oscillating a driving pulse $\phi P$, and a charge pumping circuit 105 driven by the driving pulse $\phi P$.

Figure 16:
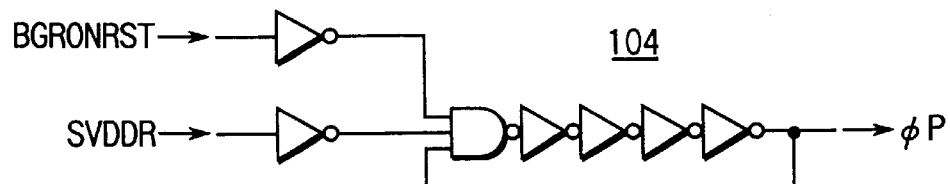
FIG. 16 is a circuit diagram of an oscillator.
Figure 17:
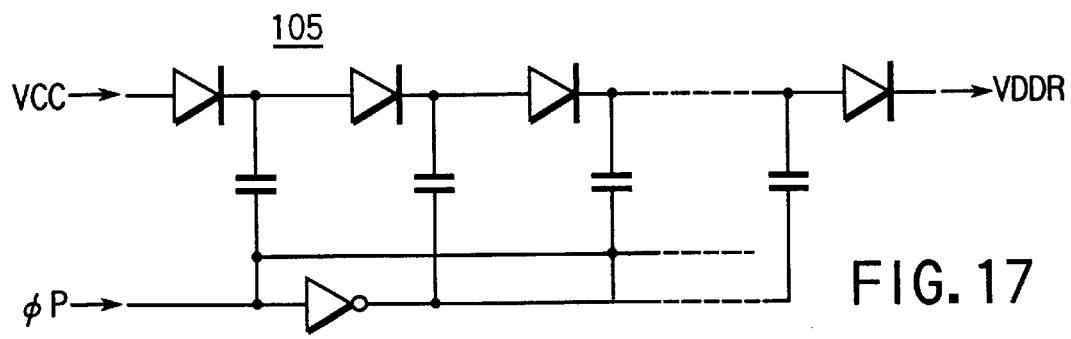
FIG. 17 is a circuit diagram of a charge pumping circuit.

FIG. 16 is a circuit diagram showing an example of the oscillator 104. FIG. 17 is a circuit diagram showing an example of the charge pumping circuit 105.

As shown in FIG. 16, the oscillator 104 is a circuit (ring oscillator) for logically oscillating an oscillation signal. The oscillator 104 receives the signal BGRONRST, starts oscillating the driving pulse $\phi P$, and drives the charge pumping circuit 105 shown in FIG. 17.

As shown in FIG. 17, the charge pumping circuit 105 has capacitors for alternately receiving the driving pulse $\phi P$ and an inverted driving pulse $/\phi P$, and boosts the power supply voltage VCC to the boosted voltage VDDR. An inactive/active state of the charge pumping circuit 105 is determined by disabling/enabling the oscillation operation of the oscillator 104.

To read out/latch data of a ROM corresponding to the nonvolatile transistor 31 after internal boosting starts, the level of the boosted voltage VDDR must be detected.

After internal boosting starts, the level of the boosted voltage VDDR is detected in step ST6. The boosted voltage VDDR is detected by a VDDR level detector 106.

Figure 18:
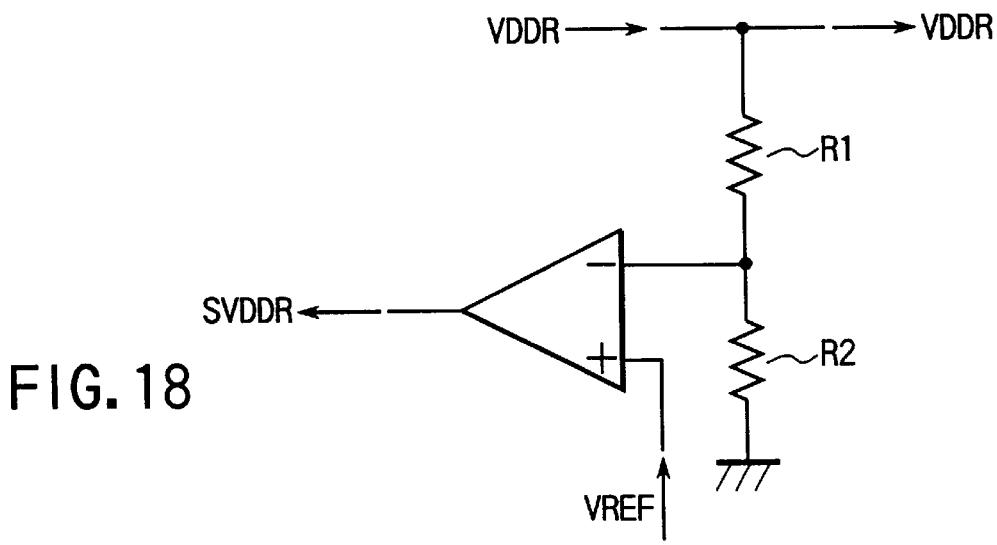
FIG. 18 is a circuit diagram of a VDDR level detector.

FIG. 18 is a circuit diagram showing an example of the VDDR level detector 106.

As shown in FIG. 18, the VDDR level detector 106 compares the reference voltage VREF with a value obtained by dividing the boosted voltage VDDR by resistors. In the fifth embodiment, since internal boosting starts after the reference voltage VREF is stabilized, the detector 106 shown in FIG. 18 outputs an "H"-level detection signal SVDDR when the boosted voltage VDDR satisfies $$VDDR = \{(R1+R2)/R2\} \cdot VREF$$

In the fourth embodiment, the detection signal SVDDR is fed back to the oscillator 104 to also be used as a signal for stopping the operation of the charge pumping circuit 105 and reducing the power consumption.

When a current flows through the boosted voltage VDDR within the chip upon operation to decrease the boosted voltage VDDR, the detection signal SVDDR changes to "L" level to operate the charge pumping circuit 105. When the charge pumping circuit 105 operates, and the boosted voltage VDDR reaches a satisfactory level again, the detection signal SVDDR changes to "H" level.

In this manner, the detection signal SVDDR alternately changes to "H" level and "L" level.

The detection signal SVDDR must be at "H" level to read out/latch data of the ROM. However, data cannot be read out/latched every time the detection signal SVDDR changes from "L" level to "H" level. This is because, during a chip operation, the latched data is in an unconfirmed state, and the operation becomes unstable. Therefore, a signal for starting the data read/latch sequence of the ROM (step ST7) when the detection signal SVDDR changes to "H" level for the first time upon power-on must be generated.

In the fourth embodiment, this signal is generated by a latch circuit 107.

Figure 19:
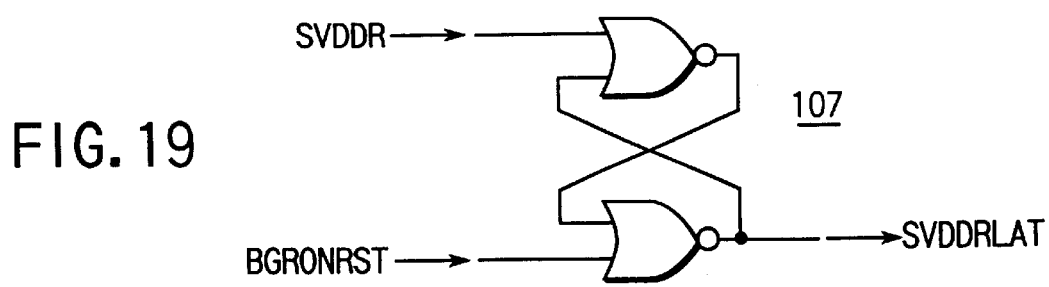
FIG. 19 is a circuit diagram of a latch circuit.

FIG. 19 is a circuit diagram showing an example of the latch circuit 107.

The latch circuit 107 shown in FIG. 19 is a flip-flop reset by the signal BGRONRST and set by the detection signal SVDDR. When the detection signal SVDDR changes to "H" level for the first time, the flip-flop 107 outputs a signal SVDDRLAT latching "H"level. The signal SVDDRLAT starts the data read/latch sequence of the ROM.

FIG. 12 shows a circuit for embodying the data read/latch sequence of the ROM shown in step ST7.

In the fourth embodiment, the embodying circuit is constituted by a fuse cell data latch trigger circuit 108, a fuse cell control circuit 109, a fuse cell 110, and a fuse cell data latch circuit 111.

The fuse cell data latch trigger circuit 108 and the fuse cell control circuit 109 are equivalent to the controller 82, the fuse cell 110 to the nonvolatile transistor 31, and the fuse cell data latch circuit 111 to a circuit including the latch circuit 40. That is, the fuse cell 110 and the fuse cell data latch circuit 111 are equivalent to the mode signal generator 16.

Figure 20:
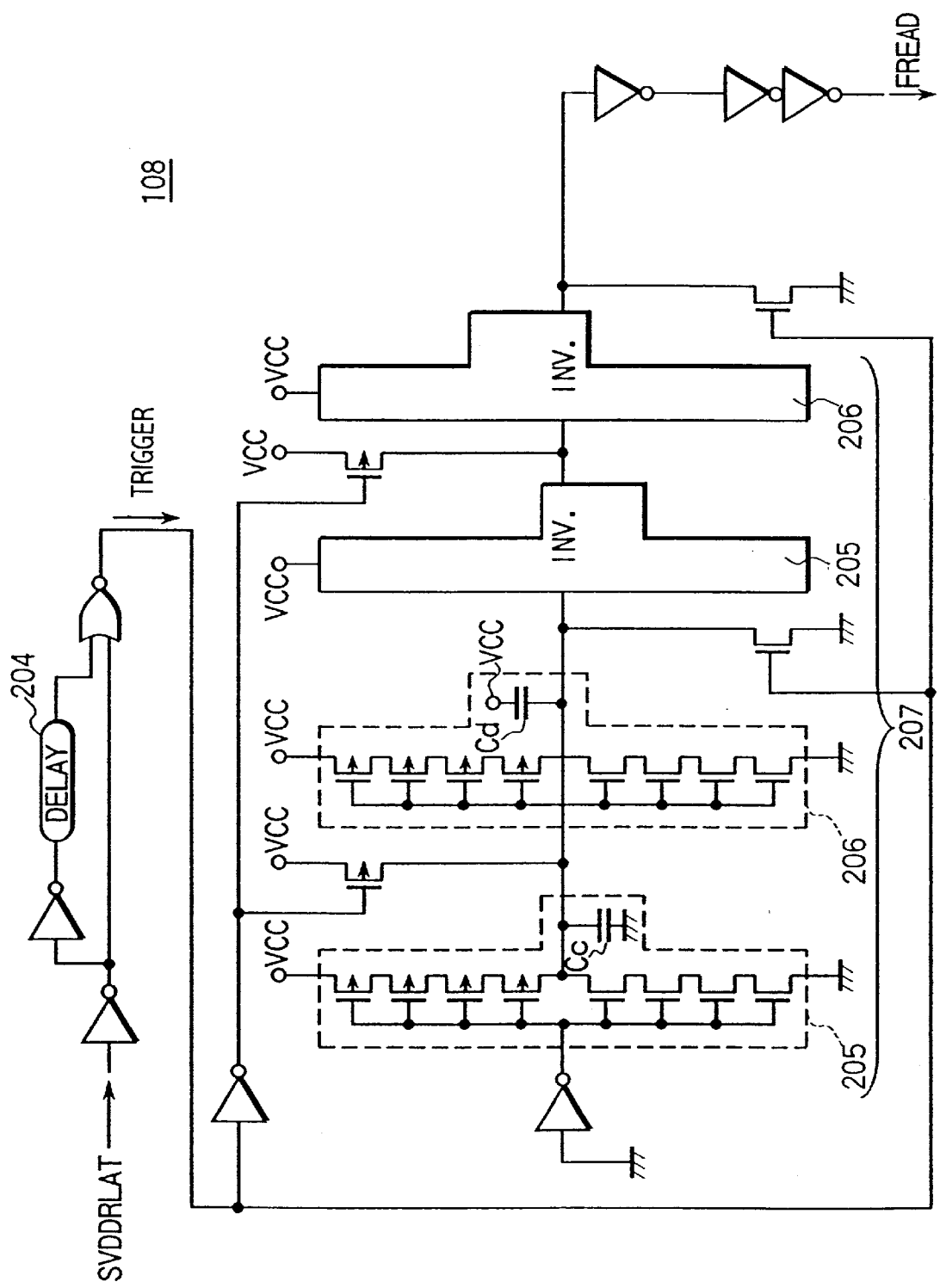
FIG. 20 is a circuit diagram of a fuse cell data latch trigger circuit.
Figure 21:
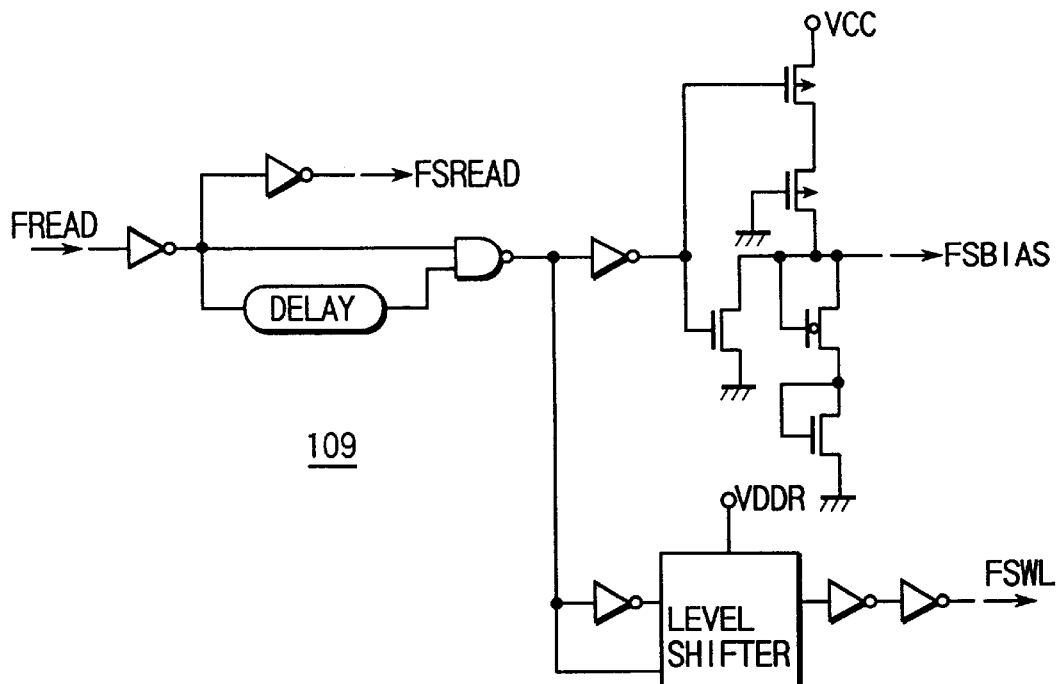
FIG. 21 is a circuit diagram of a fuse cell control circuit.
Figure 22:
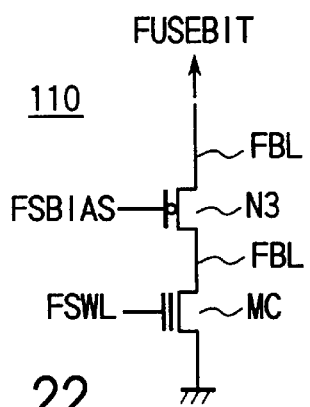
FIG. 22 is a circuit diagram of a fuse cell.
Figure 23:
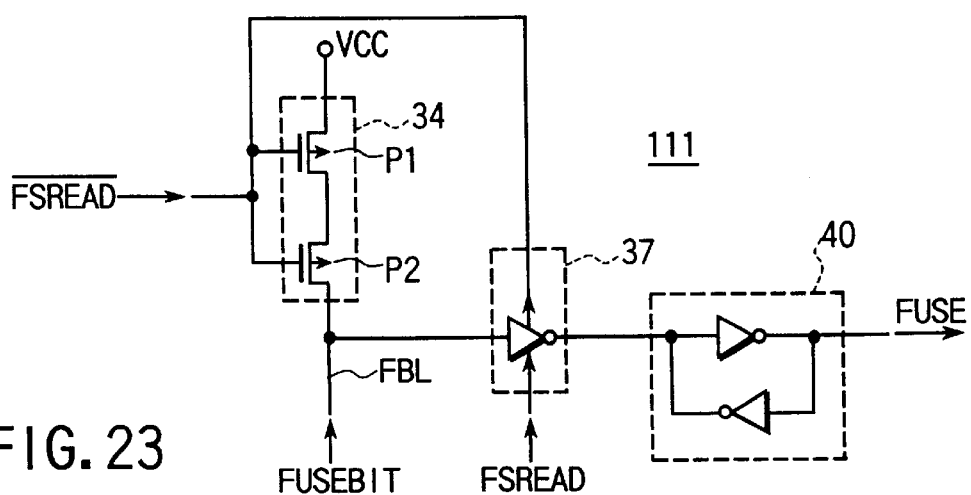
FIG. 23 is a circuit diagram of a fuse cell data latch circuit.
Figure 24:
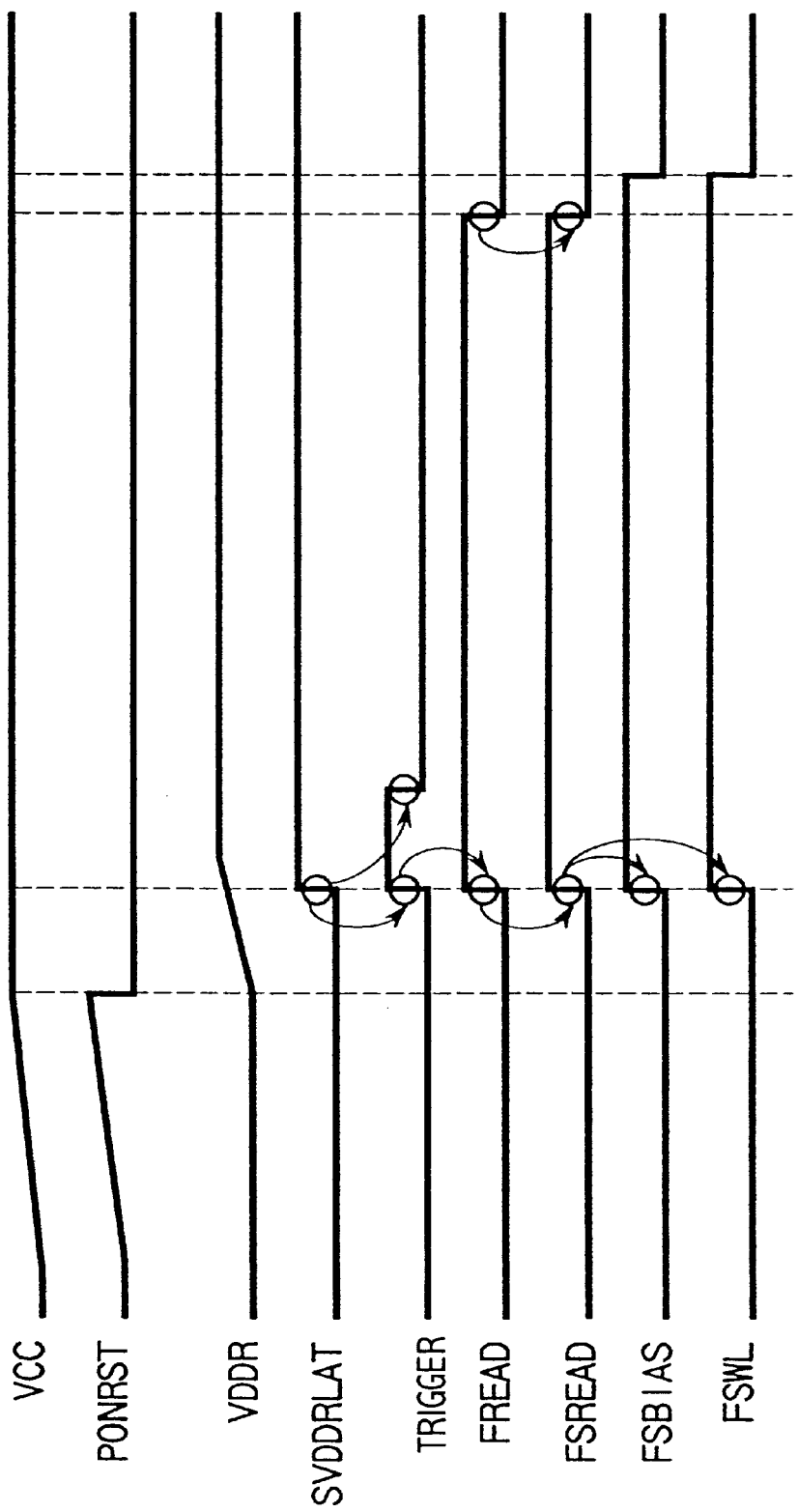
FIG. 24 is a waveform chart showing the operation of a data read/latch sequence.

FIG. 20 is a circuit diagram showing an example of the fuse cell data latch trigger circuit 108. FIG. 21 is a circuit diagram showing an example of the fuse cell control circuit 109. FIG. 22 is a circuit diagram showing an example of the fuse cell 110. FIG. 23 is a circuit diagram showing an example of the fuse cell data latch circuit 111. FIG. 24 is a waveform chart showing the operation of the data read/latch sequence.

As shown in FIG. 20, the fuse cell data latch trigger circuit 108 receives the signal SVDDRLAT to generate a trigger signal TRIGGER. The trigger signal TRIGGER is at "H"level for a period corresponding to the delay time of a delay circuit 204. When the trigger signal TRIGGER changes to "H" level, the fuse cell data latch trigger circuit 108 changes a signal FREAD to "H" level, and outputs it. The signal FREAD keeps "H" level for several ten ns (e.g., 50 ns) after the trigger signal TRIGGER changes to "L" level. The "H"-level duration is set by a delay circuit 207 obtained by alternately connecting inverters 205 each having a capacitor Cc at an output node, and inverters 206 each having a capacitor Cd at an output node.

The capacitor Cc is charged by the trigger signal TRIGGER, and the capacitor Cd is discharged by the trigger signal TRIGGER. After the trigger signal TRIGGER changes to "L"level, the capacitor Cc discharges. Upon the discharge, an input level to an inverter 206 on the output stage is inverted. Upon the inversion, the capacitor Cd of the inverter 206 is charged.

As shown in FIG. 21, the fuse cell control circuit 109 outputs an "H"-level signal FSREAD while the signal FREAD is at "H" level. The fuse cell control circuit 109 outputs signals FSBIAS and FSWL which change to "H" level after the signal FREAD changes to "H" level. The signals FSBIAS and FSWL keep "H" level for a short time (e.g., 10 ns) even after the signal FREAD changes to "L" level.

As shown in FIG. 22, the fuse cell 110 has a nonvolatile memory cell MC (corresponding to the nonvolatile transistor 31). The signal FSWL is input to the control gate of the memory cell MC, and its level is the boosted voltage VDDR.

The fuse cell 110 has an N-channel MOS transistor N3 (corresponding to the transistor 32) series-connected to a bit line FBL of the memory cell MC. The transistor N3 is made up of a natural transistor, and its threshold voltage is about 0 V. The signal FSBIAS is input to the gate of the transistor N3, and its level is the external voltage VCC lower than the boosted voltage VDDR (or the internal voltage VDD lower than the boosted voltage VDDR).

As shown in FIG. 23, the fuse cell data latch circuit 111 has P-channel MOS transistors P1 and P2 series-connected between a power supply terminal VCC and the bit line FBL. An inverted signal /FSREAD of the signal FSREAD is input to the gates of the transistors P1 and P2. The transistors P1 and P2 constitute the load 34. When the signal FSREAD is at "H" level, data FUSEBIT read from the memory cell MC is determined by the amount of currents flowed by the load 34, particularly the transistor P1 and the memory cell MC. The data FUSEBIT is latched by the latch circuit 40. When the signal FSREAD changes to "L" level, the latch circuit 40 is completely disconnected from the fuse cell 110 to confirm the data. The latch circuit 40 outputs a signal FUSE in accordance with the latched contents. The signal FUSE is equivalent to the signal MODE.

After the data is confirmed, the control gate of the memory cell MC is grounded, the transistors P1 and P2 of the load 34, and a switch 37 are turned off. Accordingly, the memory cell MC can be set in a read state for only a short time upon power-on. No extra read stress (electrical stress) is applied to the memory cell MC upon the completion of the data read/latch sequence of the ROM.

Subsequently, if the chip is in a non-selected state, the flow shifts to a standby mode in step ST8; if the chip is in a selected state, the flow shifts to, e.g., a read mode in step ST9.

In the flash EEPROM according to the fourth embodiment, the data read/latch sequence of the ROM starts after the reference voltage VREF satisfactorily stabilizes. For this reason, a satisfactorily stable boosted voltage VDDR can be applied to the gate of the memory cell MC of the fuse cell 110. A data read error and the like can be suppressed, and correct data can be latched by the latch circuit 40 of the fuse cell data latch circuit 111.

After the data of the latch circuit 40 is confirmed, the control gate of the memory cell MC of the fuse cell 110 is grounded to decrease the potential difference between the control gate and the substrate to substantially 0. With this setting, the memory cell MC of the fuse cell 110 becomes free from any electrical stress except for only a short time upon power-on. The electrical stress applied to the memory cell MC of the fuse cell 110 is smaller than, e.g., that applied to the memory cell MC of the memory cell array 11. The progress of a deterioration in memory cell MC of the fuse cell 110 is suppressed, compared to that of the memory cell MC of the memory cell array 11. This reduces the possibility of occurrence of the situation wherein the fuse cell 110 breaks before the memory cell array 11. Therefore, the reliability of the fuse cell 110 increases.

After the data of the latch circuit 40 is confirmed, the load 34 is turned off. With this arrangement, the potential difference between the source and drain of the memory cell MC of the fuse cell 110 is decreased to substantially 0. An electrical stress applied to the memory cell MC of the fuse cell 110 can be suppressed, and the reliability of the fuse cell 110 can be increased.

Further, after the data of the latch circuit 40 is confirmed, the switch 37 between the latch circuit 40 and the fuse cell 110 is turned off. With this arrangement, even if the latch circuit 40 latches data which changes a node on the fuse cell 110 side to "H" level, the potential difference between the source and drain of the memory cell MC of the fuse cell 110 can be decreased to substantially 0. Consequently, an electrical stress applied to the memory cell MC of the fuse cell 110 can be suppressed, and the reliability of the fuse cell 110 can be increased.

After the data is confirmed, the control gate of the memory cell MC of the fuse cell 110 is grounded, and the transistors P1 and P2 of the load 34 are turned off. This suppresses unwanted power consumption to realize small power consumption.

Fifth Embodiment

The fifth embodiment is directed to input of a chip enable signal /CE for selecting a chip during the data read/latch sequence of the ROM after power-on.

Input of the signal /CE during the data read/latch sequence of the ROM may cause a malfunction because latched data is not confirmed.

For this reason, a signal FEND representing the end of the data read/latch sequence is generated within the chip. This signal FEND is output from a fuse cell data latch trigger circuit 108' in the fifth embodiment.

Figure 25:
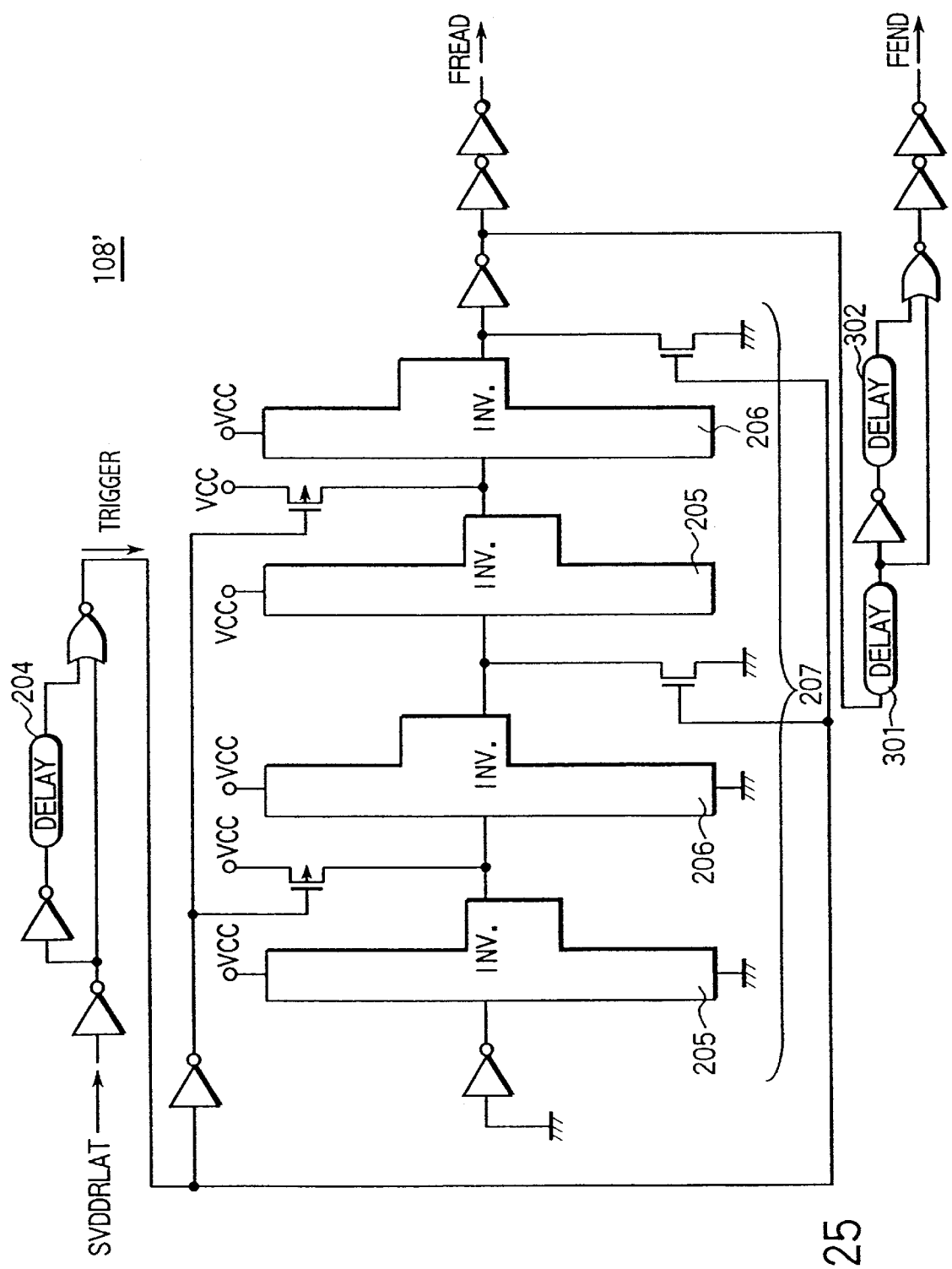
FIG. 25 is a circuit diagram of a fuse cell data latch trigger circuit according to the fifth embodiment of the present invention.

FIG. 25 is a circuit diagram showing an example of the fuse cell data latch trigger circuit 108' according to the fifth embodiment. FIG. 26 is a waveform chart showing the operation of a data read/latch sequence according to the fifth embodiment.

As shown in FIGS. 25 and 26, after a signal FREAD changes to "L" level, the signal FEND changes to "H" level upon the lapse of a delay time set by a delay circuit 301. The signal FEND keeps "H" level during a delay time set by a delay circuit 302.

Figure 27A:
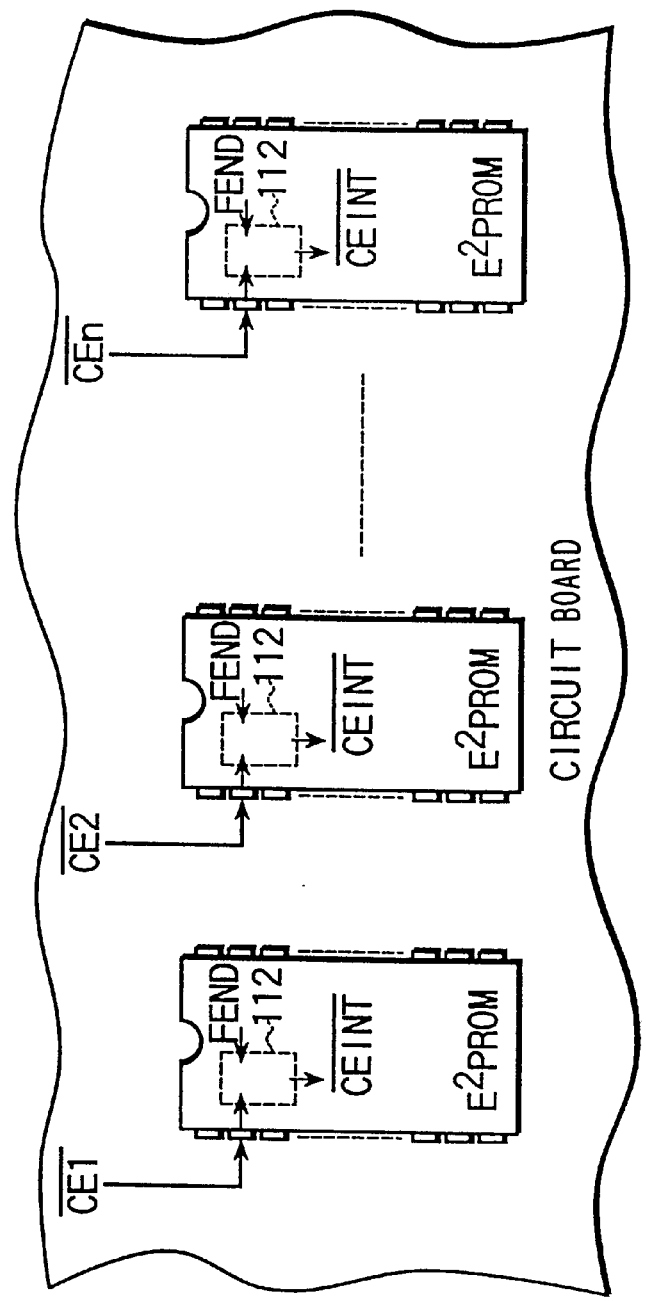
FIG. 27A is a view showing the layout of flash EEPROMs on a circuit board according to the fifth embodiment of the present invention.

FIG. 27A is a view showing the layout of flash EEPROMs on a circuit board according to the fifth embodiment.

As shown in FIG. 27A, the fifth embodiment employs internal chip enable signal output circuits 112. The internal chip enable signal output circuits 112 generate internal chip enable signals ICEINT upon reception of chip enable signals /CE (/CE1 to /CEn) externally supplied, and the signal END internally generated.

Figure 27B:
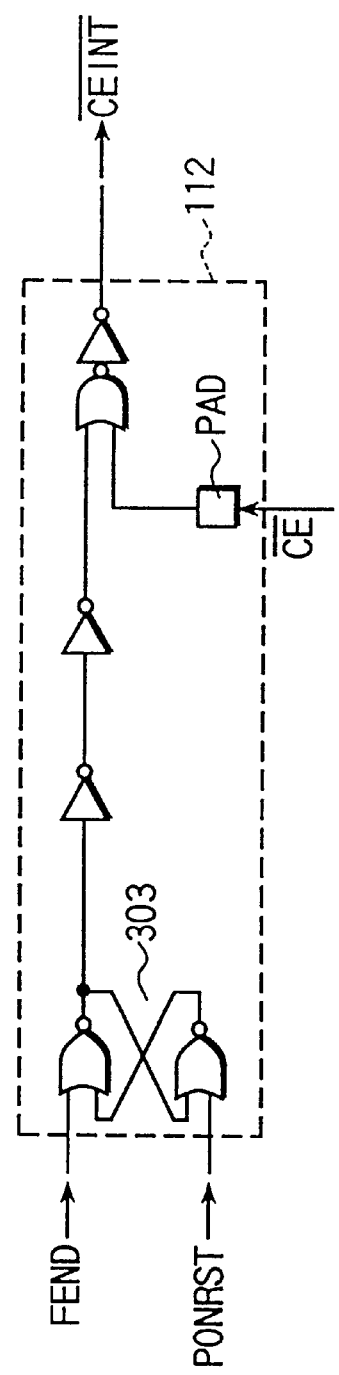
FIG. 27B is a circuit diagram of an internal chip enable signal output circuit.

FIG. 27B is a circuit diagram showing an example of each internal chip enable signal output circuit 112.

As shown in FIG. 27B, the internal chip enable signal output circuit 112 has a flip-flop 303 reset by a detection signal PONRST and set by the signal FEND.

The internal chip enable signal /CEINT is generated based on the OR between an output from the flip-flop 303 and the chip enable signal /CE.

In the flash EEPROM according to the fifth embodiment, a disabled state is held for an external chip access request during the data read/latch sequence of the ROM. This disabled state is canceled upon completion of the sequence.

In the fifth embodiment, a standby state is kept until the internal chip enable signal /CEINT is output even if the chip enable signal /CE is input. After the signal FEND is output to represent the end of the data read/latch sequence of the ROM, the chip is set in a selected state.

As a result, even if the chip enable signal /CE is input during the data read/latch sequence of the ROM, the device can be prevented from operation errors.

Sixth Embodiment)

The sixth embodiment concerns reset of the fuse cell data latch trigger circuit 108 upon power-on.

Figure 28:
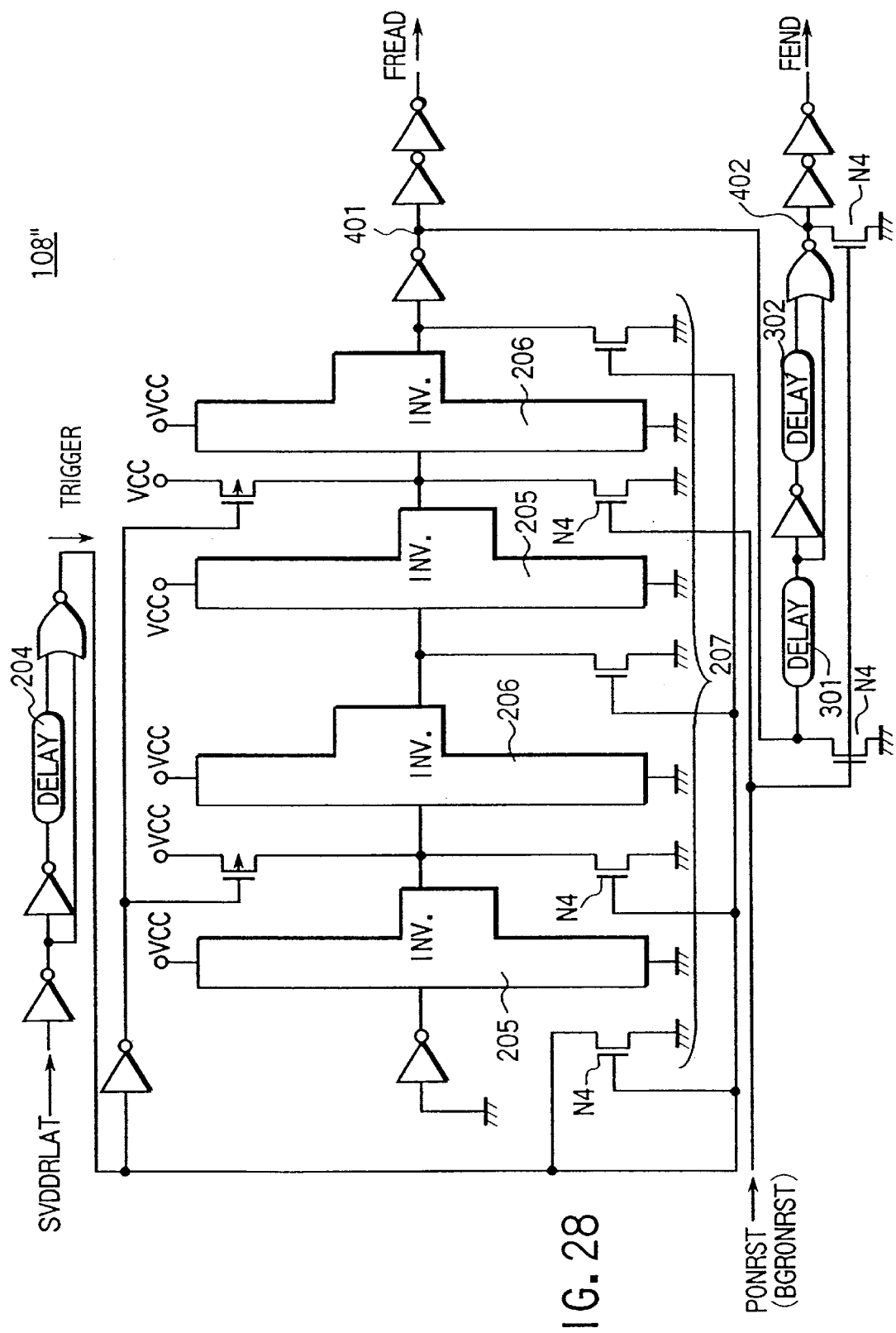
FIG. 28 is a circuit diagram of a fuse cell data latch trigger circuit according to the sixth embodiment of the present invention.

FIG. 28 is a circuit diagram showing an example of a fuse cell data latch trigger circuit 108" according to the sixth embodiment.

As shown in FIG. 28, the fuse cell data latch trigger circuit 108" comprises N-channel MOS transistors N4 respectively for resetting a substantial output node 401 of a signal FREAD, a substantial output node 402 of a signal FEND, and a delay circuit 207 by using a detection signal PONRST or signal BGRONRST.

In this way, the fuse cell data latch trigger circuit 108" can be reset using the detection signal PONRST or signal BGRONRST.

Seventh Embodiment

The seventh embodiment is about the arrangement of a fuse cell 110 on a chip.

One data FUSEBIT requires only one memory cell MC constituting the fuse cell 110, and thus only one word line is necessary. That is, a word line and a plurality of bit lines crossing the word line are formed, and a plurality of memory cells MC each having a floating gate FG are formed in a line at electrical intersections of the word line and the bit lines.

Today, however, with the advance of micro-patterning, it is very difficult to form only one word line (control gate) for the memory cells MC on a chip.

More specifically, in a technique of forming word lines by resist patterning, the reproducibility of a pattern having only one isolated fine word line is very poor. If no word line can be reproduced on a board with a design size, the characteristics of the memory cells MC may fall outside design values, and no correct data can be written/read out. This results in low reliability of the fuse cell 110.

An object of the seventh embodiment is to keep high reliability of the fuse cell 110 even when the fuse cell 110 is micro-patterned.

For this purpose, in the seventh embodiment, dummy patterns are arranged in an array (to be referred to as a fuse cell array hereinafter) wherein fuse cells 110 are aligned. A normal pattern in which the fuse cells 110 are aligned is sandwiched between the dummy patterns.

Figure 29:
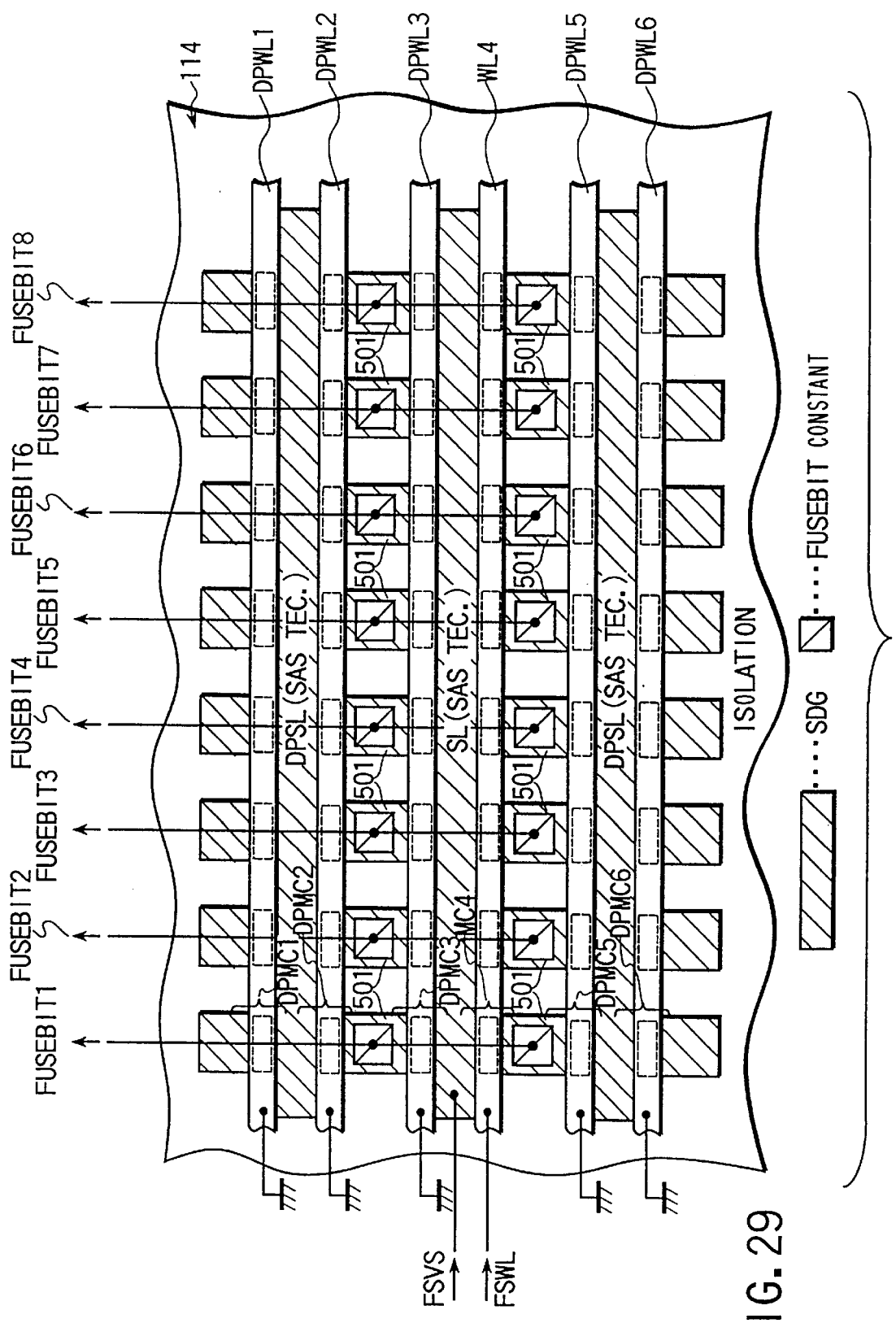
FIG. 29 is a plan view of the pattern of a fuse cell array according to the seventh embodiment of the present invention.
Figure 30:
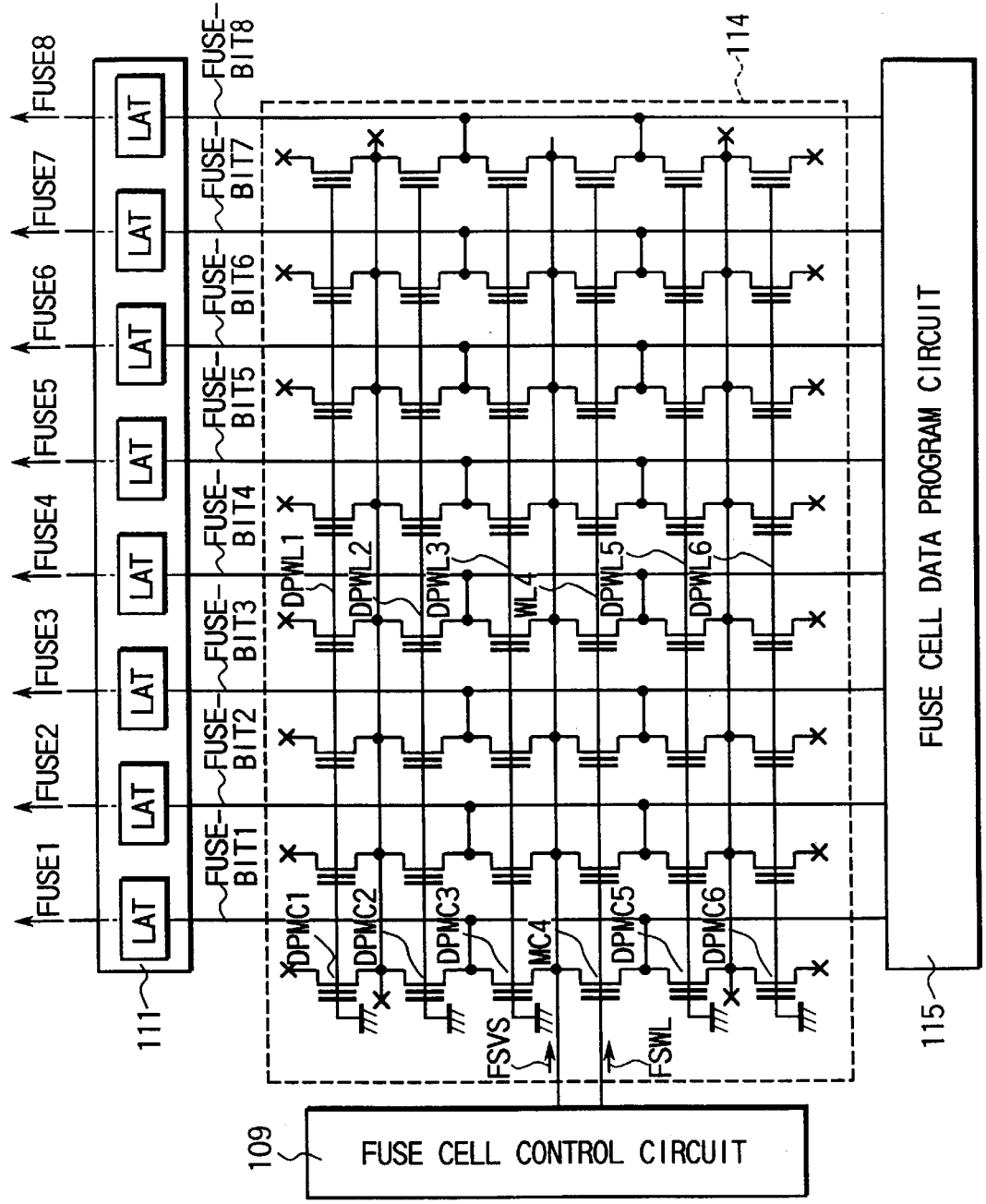
FIG. 30 is an equivalent circuit diagram of the fuse cell array according to the seventh embodiment of the present invention.

FIG. 29 is a plan view of the pattern of a fuse cell array according to the seventh embodiment. FIG. 30 is an equivalent circuit diagram of the fuse cell array.

As shown in FIGS. 29 and 30, a plurality of word lines WL and a plurality of bit lines FUSEBIT crossing these word lines WL are formed in a fuse cell array 114. The memory cells MC are formed at electrical inter-sections of the word lines WL and the bit lines FUSEBIT, and arrayed in a matrix in the fuse cell array 114.

In the fuse cell array 114 according to the seventh embodiment, six word lines WL1 to WL6 are formed. Of these word lines WL1 to WL6, the word line WL4 laid out at almost the center serves as a word line for normal memory cells MC. A signal FSWL is supplied to the word line WL4 for the normal memory cells MC. All the remaining word lines WL1 to WL3, WL5, and WL6 are dummy pattern word lines DPWL (DPWL1 to DPWL3, DPWL5, and DPWL6). For example, the dummy pattern word lines DPWL are always grounded.

A source line SL for the memory cells MC is formed by a self-aligned source technique (SAS TEC.) using the word lines WL as a mask.

Three source lines SL are formed in the fuse cell array 114 according to the seventh embodiment. Of the three source lines SL, a central source line SL serves as a source line for the normal memory cells MC. A signal FSVS is supplied to the source line SL for the normal memory cells MC. The voltage of the signal FSVS changes depending on a write/ read/erase mode. All the remaining source lines are dummy pattern source lines DPSL, and, e.g., float.

Of memory cells MC1-to MC6 aligned along the bit lines FUSEBIT, the memory cells MC4 are normal memory cells MC. All the remaining memory cells MC1 to MC3, MC5, and MC6 are dummy pattern memory cells DPMC (DPMC1 to DPMC3, DPMC5, and DPMC6). The normal memory cells MC4 are electrically connected to the bit lines FUSE-BIT via fuse bit contacts 501.

In the fuse cell array 114 according to the seventh embodiment, each fuse bit contact 501 is shared by adjacent memory cells MC. Each normal memory cell MC4 shares the fuse bit contact 501 with the dummy pattern memory cell DPMC5. However, no dummy pattern memory cell DPMC5 is selected because the word line DPWL5 for the dummy pattern memory cell DPMC5 is grounded.

One end of each of the bit lines FUSEBIT1 to FUSEBIT8 is connected to a latch circuit 111, and the other end is connected to a fuse cell data program circuit 115. The fuse cell data program circuit 115 is used in writing data in the memory cell MC.

As described above, the dummy patterns are formed in the fuse cell array 114, and the normal word line WL is sandwiched between the dummy pattern word lines DPWL. Even the normal word line WL which should be originally isolated can be faithfully reproduced on a board with a design size. Consequently, the characteristics of the normal memory cells MC can be prevented from falling outside design values. Correct data can be written/ read out, and the reliability of the fuse cell 110 increases.

Eighth Embodiment

The eighth embodiment is about the type of data stored in a fuse cell 110.

As described in the first embodiment, various types of data stored in the fuse cell 110 are conceivable. Typical examples of the data are
(a) redundancy data for activating/deactivating a redundancy defective address and a spare decoder,
(b) data representing the address of a write/erase inhibit block,
(c) bit configuration setting data for determining the number of bits of I/O data,
(d) switching data for a pad location corresponding to a package,
(e) TOP BOOT/BOTTOM BOOT switching data for determining the size of a block subjected to a data erase, and
(f) data for deactivating (inhibiting the use of) an internal test circuit represented by, e.g., a built-in test circuit used to test a chip.

In the fuse cell 110, these pieces of chip operation/ function setting information are stored, and the operation and function of the chip are set in accordance with these operation/function setting information.

Figure 31:
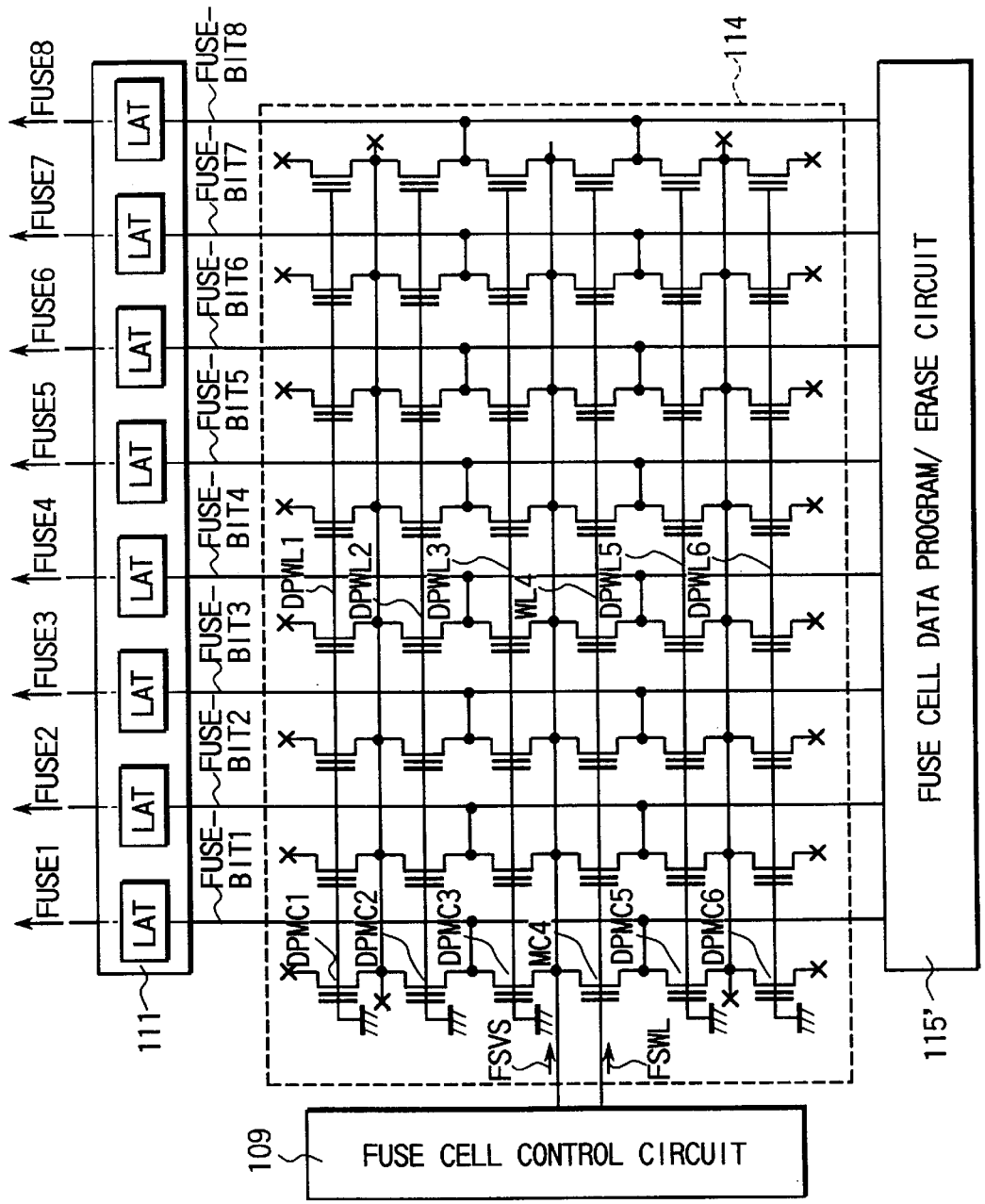
FIG. 31 is an equivalent circuit diagram of a fuse cell array according to the eighth embodiment of the present invention.

FIG. 31 is an equivalent circuit diagram of a fuse cell array according to the eighth embodiment.

In a conventional concept, data (a) to (f) are set by the manufacturer. Data (a) to (f) are stored in a read-only ROM by a fuse or bonding option method.

In a flash EEPROM described in the first to seventh embodiments, a writable ROM is used for a memory cell of the main body, so that the memory cell MC of the fuse cell 110 can be made up of a writable ROM. Accordingly, data can be rewritten.

As shown in FIG. 31, in the ninth embodiment, to allow rewrite of data (a) to (f), a fuse cell data program/erase circuit 115' is connected to bit lines FUSEBIT of memory cells MC.

According to the ninth embodiment, not only the manufacturer but also the user can switch, of data (a) to (f), for example,
(b) data representing the address of a write/erase inhibit block,
(c) bit configuration setting data for determining the number of bits of I/O data, and
(e) TOP BOOT/BOTTOM BOOT switching data for determining the size of a block subjected to a data erase. By allowing the user to switch data (b), (c), and (e), a product convenient for the user can be provided.

Ninth Embodiment

The ninth embodiment is about the layout of a fuse cell array 114 on a chip.

Figure 32:
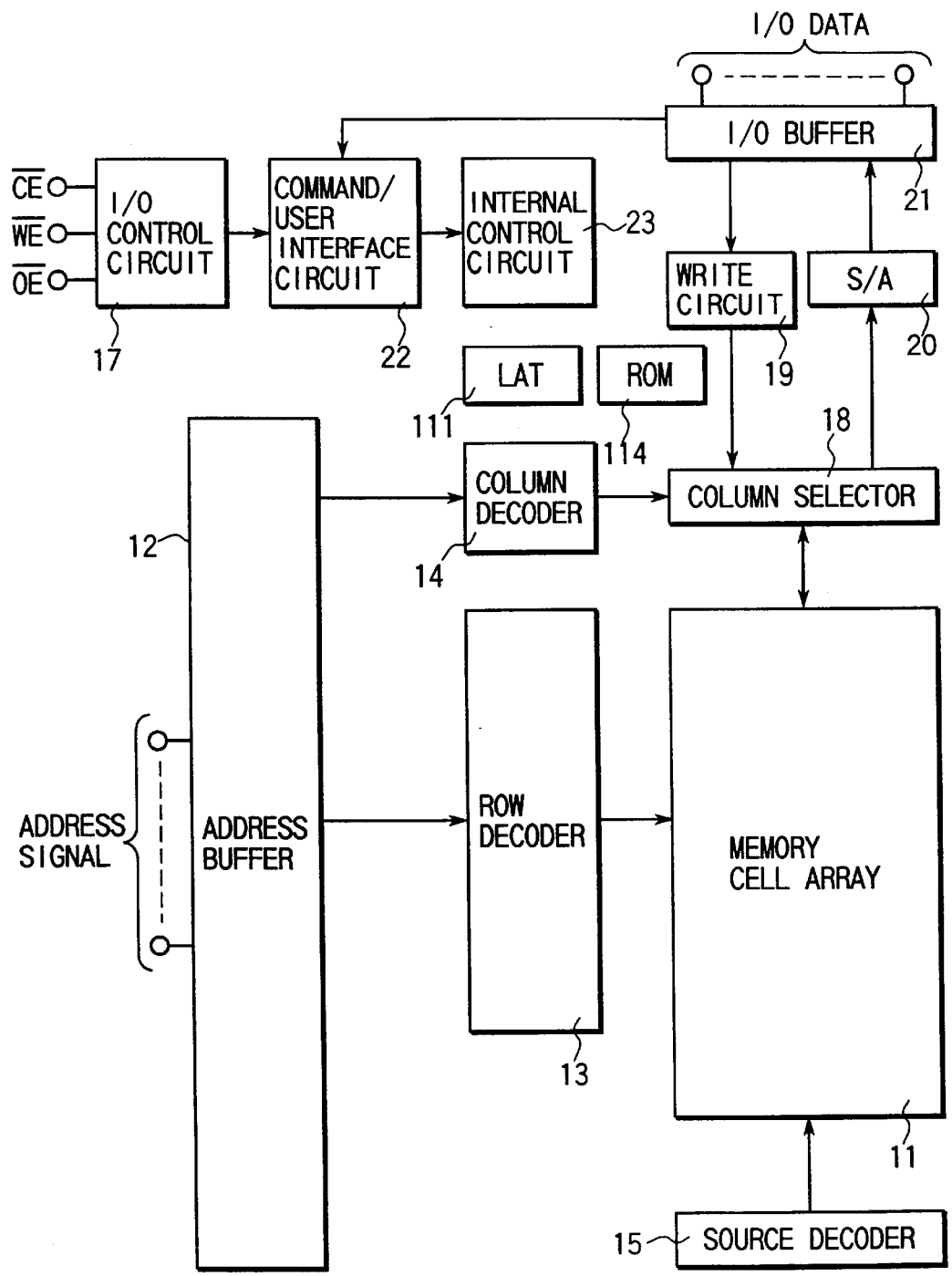
FIG. 32 is a block diagram showing an example of the arrangement of a flash EEPROM according to the ninth embodiment of the present invention.

FIG. 32 is a block diagram showing an example of the arrangement of a flash EEPROM according to the ninth embodiment.

As shown in FIG. 32, some fuse cells 110 are grouped into one fuse cell array 114, and collectively laid out at a given portion.

By grouping the fuse cells 110 into one fuse cell array 114, and collectively laying them out, the fuse cells 110 can be efficiently laid out on the chip, and particularly an increase in chip area can be suppressed.

The fuse cell array 114 is arranged near a fuse cell data latch circuit 111 in the ninth embodiment.

Tenth Embodiment

The tenth embodiment exemplifies the formation direction of a word line WL formed on a fuse cell array 114.

Figure 33:
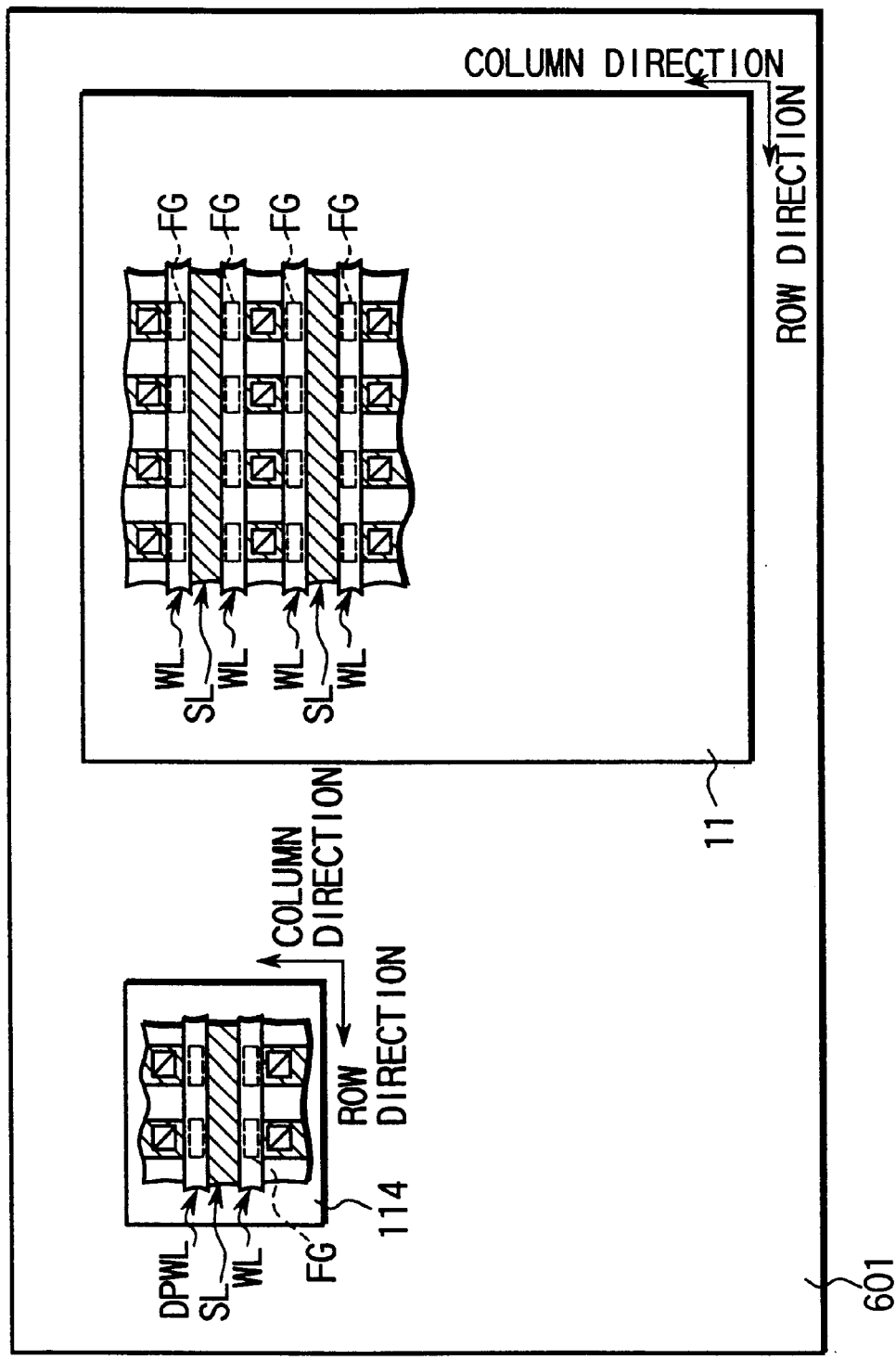
FIG. 33 is a view showing the relationship between the fuse cell array of a flash EEPROM according to the tenth embodiment of the present invention, and a main memory cell array.

FIG. 33 is a view showing the relationship between the fuse cell array of a flash EEPROM according to the tenth embodiment, and a main memory cell array.

As shown in FIG. 33, the fuse cell array 114 and a main memory cell array 11 are formed on one chip 601. In the fuse cell array 114 and the main memory cell array 11, a plurality of word lines WL, and a plurality of bit lines (not shown) crossing these word lines WL are formed. A plurality of memory cells each having a floating gate FG are formed at electrical intersections of the word lines WL and the bit lines.

In the fuse cell array 114 and the main memory cell array 11, the direction of the word line WL formed on the fuse cell array 114 preferably coincides with the direction of the word line WL formed on the main memory cell array 11.

If the directions of the word lines WL do not coincide with each other, the characteristics of a memory cell formed in the fuse cell array 114 may be greatly different from those of a memory cell formed in the main memory cell array 11 due to a problem in process. The difference in characteristics makes it difficult to read out data using the same boosted voltage VDDR with high reliability.

The problem in process is, e.g., a "shadow effect". The source and drain regions of a memory cell are formed by "ion"-implanting an impurity serving as the donor/accepter of a semiconductor by using the word lines WL as a mask.

In general, these "ions" are implanted obliquely at a predetermined angle with respect to a semiconductor substrate such as a silicon wafer. In this implantation, the impurity implanted in the source and drain regions is shielded by the word lines WL, and the concentration differs between the source and drain regions. This is a so-called "shadow effect". The difference in concentration between the source and drain regions changes the characteristics of the memory cell.

In the tenth embodiment, to solve this problem, the word line WL in the fuse cell array 114 is formed in the same direction as that of the word line WL formed in the main memory cell array 11.

More specifically, by making the formation directions of the word lines WL in the fuse cell array 114 and the main memory cell array 11 coincide with each other, e.g., the source/drain region of a memory cell formed in the fuse cell array 114, and that of a memory cell in the main memory cell array 11 can be formed under the same conditions. As a result, both the memory cells can have the same characteristics.

If the memory cells formed in the fuse cell array 114 and the main memory cell array 11 have the same characteristics, data can be read out from the fuse cell array 114 and the main memory cell array 11 using, e.g., the same boosted voltage VDDR with high reliability.

If data can be read out from the fuse cell array 114 and the main memory cell array 11 using, e.g., the same boosted voltage VDDR, the fuse cell array 114 and the main memory cell array 11 can share a generator for generating the boosted voltage VDDR, e.g., in the first to ninth embodiments, a circuit portion made up of the ring oscillator 104, the charge pumping circuit 105, the VDDR level detector 106, and the like.

Sharing the circuit portion for generating the boosted voltage VDDR by the fuse cell array 114 and the main memory cell array 11 can suppress an increase in chip area. Particularly, a capacitor included in the charge pumping circuit 105 requires a large area. An increase in chip area can be greatly suppressed by sharing the circuit including the charge pumping circuit 105, i.e., the booster 81 by the fuse cell array 114 and the main memory cell array 11.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A detecting circuit formed on a semiconductor substrate with a fixed potential point and a variable potential point having a potential difference from the fixed potential point that changes upon power-on, to detect that the potential difference between the fixed potential point and the variable potential point reaches a predetermined potential difference, comprising:

a first resistor connected to the variable potential point; and a second resistor not connected to the variable potential point, and wherein said first resistor is formed in a first semiconductor region biased to a potential of the variable potential point, and said second resistor is formed in a second semiconductor region biased to a potential of the fixed potential point.

2. A circuit according to claim 1, wherein the fixed potential is a ground potential, said first resistor is a p-type diffusion resistor formed in an n-type semiconductor region, and said second resistor is an n-type diffusion resistor formed in a p-type semiconductor region.

3. A detecting circuit for detecting a power-on potential level, said detecting circuit being formed on a semiconductor substrate with a fixed potential point and a variable potential point having a potential difference from the fixed potential point that changes upon power-on, to detect that the potential difference between the fixed potential point and the variable potential point reaches the power-on potential level, comprising:

a first resistor connected to the variable potential point; and a second resistor not connected to the variable potential point, and wherein said first resistor is formed in a first semiconductor region biased to a potential of the variable potential point, and said second resistor is formed in a second semiconductor region biased to a potential of the fixed potential point.

4. The circuit according to claim 3, wherein the fixed potential is a ground potential, said first resistor is a p-type diffusion resistor formed in a n-type semiconductor region, and said second resistor is an n-type diffusion resistor formed in a p-type semiconductor region.

5. The circuit according to claim 4, wherein the variable potential is a power supply potential.

6. The circuit according to claim 5, wherein the n-type semiconductor region is biased to the power supply potential, and the p-type semiconductor region is biased to the ground potential.

7. The circuit according to claim 3, further comprising:

a low pass filter coupled between the variable potential point and a power supply terminal.

8. The circuit according to claim 7, wherein the fixed potential is a ground potential, said first resistor is a p-type diffusion resistor formed in an n-type semiconductor region, and said second resistor is an n-type diffusion resistor formed in a p-type semiconductor region.

9. The circuit according to claim 8, wherein the variable potential is a power supply potential.

10. The circuit according to claim 9, wherein the n-type semiconductor region is biased t the power supply potential, and the p-type semiconductor region is biased to the ground potential.

* * * * *

UNITED STATES PATENT AND TRADEMARK OFFICE
CERTIFICATE OF CORRECTION

PATENT NO. : 6,320,428 B1  
DATED : November 20, 2001  
INVENTOR(S) : Shigeru Atsumi et al.

Page 1 of 1

It is certified that error appears in the above-identified patent and that said Letters Patent is hereby corrected as shown below:

<u>Title page,</u>  
Item [56], References Cited, U.S. PATENT DOCUMENTS,  
"7/1991" should read -- 7/1989 --, and "5/1998" should read -- 11/1996 --.

<u>Column 24,</u>  
Line 54, "t" should read -- to --.

Signed and Sealed this

Twenty-first Day of March, 2006

JON W. DUDAS  
*Director of the United States Patent and Trademark Office*